(12) United States Patent
Sumida et al.

(10) Patent No.: US 6,677,521 B2
(45) Date of Patent: Jan. 13, 2004

(54) ELECTRICAL JUNCTION BOX FOR A VEHICLE

(75) Inventors: Tatsuya Sumida, Yokkaichi (JP); Yuuji Saka, Yokkaichi (JP); Noriko Kobayashi, Yokkaichi (JP); Hisaki Mayumi, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 10/418,168

(22) Filed: Apr. 18, 2003

(65) Prior Publication Data

US 2003/0205398 A1 Nov. 6, 2003

Related U.S. Application Data

(62) Division of application No. 09/984,064, filed on Oct. 26, 2001.

(30) Foreign Application Priority Data

| Oct. 30, 2000 | (JP) | 2000-330931 |
| Nov. 6, 2000 | (JP) | 2000-338048 |
| Oct. 26, 2001 | (JP) | 2000-326959 |

(51) Int. Cl.$^7$ ................................................ H02G 3/08
(52) U.S. Cl. .................. 174/50; 174/52.1; 174/59; 439/76.2
(58) Field of Search .................. 174/50, 52.1, 52.6, 174/70 B, 71 B, 72 B, 88 B, 99 B, 129 B, 68.2, 59, 60; 439/76.1, 76.2, 74, 949, 65

(56) References Cited

U.S. PATENT DOCUMENTS

| 5,057,026 | A | * | 10/1991 | Sawai et al. ............... 439/76.2 |
| 5,295,842 | A | * | 3/1994 | Ozaki et al. ............... 439/76.2 |
| 6,270,361 | B1 | * | 8/2001 | Onizuka et al. ........... 439/76.2 |
| 6,310,293 | B1 | * | 10/2001 | Kawakita ................... 174/70 B |
| 6,353,190 | B1 | * | 3/2002 | Sumida et al. ............. 174/71 B |
| 6,506,060 | B2 | | 1/2003 | Sumida et al. |
| 6,514,091 | B2 | * | 2/2003 | Saito et al. ................. 439/76.2 |
| 6,524,113 | B1 | * | 2/2003 | Oka ........................... 439/949 |
| 6,583,353 | B2 | * | 6/2003 | Murakoshi et al. ........... 174/50 |
| 6,600,658 | B2 | * | 7/2003 | Iwata ........................... 174/50 |
| 6,607,115 | B2 | * | 8/2003 | Kobayashi et al. ......... 174/99 B |

FOREIGN PATENT DOCUMENTS

| EP | 1 145 914 A2 | 10/2001 |
| JP | 5-39124 | 5/1993 |
| JP | 2525430 | 11/1996 |
| JP | 2000-112691 | 4/2000 |
| JP | 2000-139016 | 5/2000 |

* cited by examiner

Primary Examiner—Dean A. Reichard
Assistant Examiner—Angel R. Estrada
(74) Attorney, Agent, or Firm—Oliff & Berridge, PLC

(57) ABSTRACT

An electrical junction box for a vehicle has a casing, and an electrical circuit comprising a fuse connection circuit, a relay connection circuit and a connector connection circuit. The casing has, at opposite sides, connector sockets for electrical connectors. In the casing is a connector module comprising a plurality of insulation substrates stacked one on another and parallel elongated bus bars on a first surface of each substrate and parallel flexible conductors on a second surface of the substrate, which extend orthogonally to said bus bars. Each said insulation substrate has apertures through it at which the bus bars and flexible conductors are connected to each other to provide desired circuit connections. The bus bars extend from the insulation substrates and provide tabs projecting into the connector sockets. A thin junction box is obtained.

15 Claims, 23 Drawing Sheets

ELECTRICAL JUNCTION BOX FOR A VEHICLE

This is a Division of application Ser. No. 09/984,064 filed Oct. 26, 2001. The entire disclosure of the prior application is hereby incorporated by reference herein in its entirety.

BACKGROUND OF THE INVENTION

1. Field of Invention

The present invention relates to an electrical junction box for a vehicle, in particular a box to be connected to a wire harness for a vehicle. The invention is intended to provide a junction box which is thin and compact even though the number of circuits is increased. The invention also provides a vehicle, such as an automobile, having the electrical junction box mounted on it.

2. Description of Related Art

Recently, the rapid increase in the number of electric and electronic component parts which are mounted on a vehicle has led to increase in the number of circuits to be accommodated in a junction box in the vehicle. When forming branch circuits at high density, it is necessary to mount a large number of component parts on the junction box, which increases the number of assembly stages.

The assignees of the present application proposed the junction box 1 shown in present FIG. 21 in JP-A-2000-112691 (corresponding to EP-A-1145914 and U.S. patent application Ser. No. 09/833,595). The junction box of FIG. 21 is intended to be thin, capable of permitting circuit alteration and reducing the time and labor required for its assembly from component parts.

In the junction box 1 of FIG. 21, a connector connection circuit (base circuit), a fuse connection circuit, and a relay connection circuit provided in the junction box are formed separately as a connector module 2, a fuse module 3 and a relay module 4. The connector module 2, the fuse module 3 and the relay module 4 are incorporated in the casing composed of the lower case part 5 and the upper case part 6.

In each of the connector module 2, the fuse module 3 and the relay module 4, bus bars 2b, 3b and 4b are fixed to insulation substrates 2a, 3a and 4a respectively, and project from the periphery of the insulation substrates to which they are attached.

Because the whole circuit of the junction box is divided into the connector module 2, the fuse module 3 and the relay module 4, overlap of the bus bar tabs can be avoided. Thus, the formation of multiple layers of bus bars can be prevented. Therefore, the junction box can be thin, and the circuits of the bus bars can be more easily wired. Thus, it is possible to reduce the area of the bus bar for each module. Consequently, even though the connector connection bus bars, the fuse connection bus bars and the relay connection bus bars are formed separately, the total area of all the bus bars can be reduced and the area of the junction box can be kept to a minimum.

Further, when the specification of any one of the connector circuit, the fuse circuit and the relay circuit is altered, it is only necessary to alter the respective module. Thus, the junction box permits alteration of the specification easily.

However, the bus bars used as electrical conductors in the modules are generally formed by punching metal sheet into a form corresponding to a complicated configuration of the circuit of the module. Thus, the yield of the metal sheet is low. Further, when a circuit alteration is made, it is necessary to make a new punching die, which can increase costs.

Further, depending on a circuit configuration, it may be impossible to form the circuit as a single layer. Thus the number of bus bar layers increase.

For example, as shown diagrammatically in FIG. 22A, in connecting circuits C1 and C2 to connectors 7A and 7B of a connector module 2 and to a fuse 8 of a fuse module 3 disposed on the side of the connector module, the circuits C1 and C2 of the connector module 2 cannot be connected to the fuse 8 unless the circuits C1 and C2 are disposed in separate layers. Thereby, the number of layers is increased.

Although the number of component parts mounted on a vehicle has increased rapidly, space for the junction box has remained limited. Thus, it is essential to make the junction box as thin as possible.

SUMMARY OF THE INVENTION

It is an object of the present invention to provide a junction box which is thin and can be manufactured at a low cost, in particular by improving the yield of a conductive metal plate.

It is a further object of the invention to simplify the wiring and conductor arrangements in a junction box and provide simplified methods of making the connector module of the junction box.

According to a first aspect of the invention, there is provided an electrical junction box having a casing and an electrical circuit in the casing adapted to make electrical connection, in use, to electrical connectors, fuses and relays. The electrical circuit comprises a fuse connection circuit, a relay connection circuit and a connector connection circuit, which is electrically connected to the fuse connection circuit and the relay connection circuit. The casing comprises a fuse circuit portion, containing the fuse connection circuit, and a relay circuit portion, containing the relay connection circuit. The casing also has two laterally opposite sides, each of which forms a connector accommodation portion adapted to receive, in use, at least one electrical connector.

Additionally, the electrical junction box may further have, mounted within the casing, a connector module providing the connector connection circuit that comprises a plurality of insulation substrates stacked one on another and each having a first main surface and a second main surface opposite the first main surface. A plurality of parallel elongate bus bars may be arranged on the first main surface of each substrate and extends in a first direction, and a plurality of parallel flexible conductors may be arranged on the second main surface of each insulation substrate and extends in a second direction orthogonal to the first direction. A plurality of apertures pass through each insulation substrate from the first main surface to the second main surface. The bus bars and the flexible conductors are connected to each other by welding to provide desired circuit connections at these apertures. The bus bars of each insulation substrate are oriented in the lateral direction of the casing between the opposite sides, some of which extend from the insulation substrates in the first direction and provide tabs that project into the connector accommodation portions.

The flexible conductors of each connector module may be single-core wires, or conductors of a flexible flat cable arranged on the second main surface of the insulation substrate, the flexible flat cable comprising flexible insulation material in which the conductors are held.

Thus in the connector module, the elongated bus bars and the flexible conductors cross each other, with the insulation substrate interposed between them, and are connected to each other at crossing positions to form the circuit of the connector module. Thus, it is possible to set the interval between the bus bars equal to the interval between the terminals of a connector to be attached to the box, in use. Thus, the tabs formed at both ends of the bus bars can project horizontally into the connector accommodation portion formed on the side surface of the box, with or even without bending the tabs.

In the circuit shown in FIG. 22B, in comparison with that of FIG. 22A, the conductors 21 can be connected to the fuses 35 while connecting both ends of the bus bars 22, constituting circuits C1 and C2, of the connector module 11 to connectors 7A' and 7B'. Thus, it is possible to connect the bus bars 22 to the conductors 21, disposed on the other side of the insulation substrate 20, orthogonally to the bus bars 22, with the insulation substrate 20 interposed between the bus bars 22 and the conductors 21. Consequently, this simple circuit of the connector module 11 can be formed from a single circuit layer having the bus bar disposed on one surface of the insulation substrate and the conductors disposed on the other surface thereof. This simple example illustrates the principle of this aspect of the invention. That is, it is possible to reduce the number of layers of the bus bar to produce a thin junction box.

Even though the connector accommodation portion is formed on the side surface of the box, the tabs of the bus bars can project into the connector accommodation portion at the side surface of the side case without interference from adjacent tabs or deformation thereof. Further, even though the connector is disposed on the side surface of the box, the bus bars can be disposed in a simple construction. Thus, a relay terminal for connecting bus bars interlaminarly is unnecessary and the construction of the circuit of the connector module can be kept simple.

The number of layers of the substrates of the connector module may be equal to the number of rows of terminals of a connector which fits in the connector accommodation portion.

That is, as described above, the tabs formed at both ends of the bus bar disposed on one surface of each substrate of the connector module project into the connector accommodation portions. Thus, the number of layers of the substrates of the connector module may be equal to the number of rows (stages) of terminals of the connector, which fits in the connector accommodation portion. In other words, the connector can be easily disposed on the side surface of the box when the number of the rows (stages) of the connector is equal to the number of the substrates.

A further layer consisting of bus bars may be formed as an additional, e.g. lowermost layer, of the connector module. The total of the number of layers of the substrates and the number of further layers of the bus bars may be not less than the number of rows (stages) of terminals of the connector which fits in the connector accommodation portion. Preferably, the elongate bus bars are not connected to the power source side and to the power supply side of the fuses. For efficient wiring of the bus bars, it is preferable to use one bus bar having a plurality of fuse connection terminals formed at one end thereof. Thus as the bus bar having a plurality of fuse connection terminals formed at one end thereof, it is preferable not to use the elongate bus bars but use the bus bars formed by punching a conductive metal plate corresponding to the configuration of a desired circuit. The elongate bus bars may be disposed on a layer on which the bus bar formed by punching the conductive metal plate is disposed, and the ends of the elongate bus bars project horizontally as tabs. Consequently, the total of the number of the substrates and the number of the further layers of the bus bars is equal to the number of the rows (stages) of terminals of the connector.

The ends (tabs) of the elongate bus bars that project into the connector accommodation portion may be kept flat, so that the tabs of different bus bar layers do not interfere with each other. Otherwise, if the tabs are bent and project from the bus bars disposed on one substrate, the tabs may interfere with tabs projected from the substrates of other layers.

However, bent tabs of a bus bar that project into the connector accommodation portion may be accommodated if bent in a manner that kept the tab horizontal, e.g. in the shape of a letter "L" or a single zig-zag. By bending the tabs of the same layer in the same configuration and arranging the tabs to remain parallel with one another, and bending the tabs of the bus bars from other layers in the same configuration, interlaminar interference between the tabs is avoided.

Compared to the conventional process of forming bus bars, such as by punching a conductive metal plate corresponding to the configuration of a circuit, it is possible to improve the yield of the conductive metal plate considerably, by employing strip-shaped elongate bus bars of uniform width. Further, the construction can cope with alteration of the circuit construction by simply changing the position where the flexible conductors and bus bars cross each other and are welded to each other. Because it is unnecessary to alter the conductive material itself with the change of the circuit construction, the construction can easily permit alteration of the circuit construction without increasing the manufacturing cost.

According to a second aspect of the invention there is provided an electrical junction box having a casing, and an electrical circuit in the casing adapted to make electrical connection, in use, to electrical connectors, fuses and relays. The electrical circuit comprises a fuse connection circuit, a relay connection circuit and a connector connection circuit which is electrically connected to the fuse connection circuit and the relay connection circuit.

The casing comprises a fuse circuit portion, containing the fuse connection circuit, and a relay circuit portion, containing the relay connection circuit. The electrical junction box may further comprise a connector module, mounted in the casing, which provides a connector connection circuit that comprises at least one insulation substrate having a first main surface and an opposite second main surface, and a plurality of spaced parallel flexible conductors arranged on the second main surface. The relay connection circuit comprises a plurality of bus bars, each having one end arranged to make a connection, at least, in use, to relays and another end that constitutes a pressure connection terminal, which is connected by pressure connection directly to intermediate points of at least some of the flexible conductors of the connector module. In this construction, the connector module is formed with spaced conductors, e.g. parallel with one another, and the pressure connection terminals at the ends of the bus bars of the relay connection circuit are connected to the intermediate points of the conductors by pressure connection, which reduces the number of welded connections required.

The ends of the conductors of the connector module may be connected, e.g. by pressure connection, to the terminals formed at an end of the bus bars of the fuse module, and through relay terminals the other ends of the conductors may be connected to an electronic control unit accommodated in the junction box. Thereby the circuit of the connector module can be connected to the relay module, the fuse module and the electronic control unit by pressure connections between the conductors and the terminals. By effectively utilizing the one end, the intermediate portion and the other end of the conductors of the connector module, the circuit of the connector module can be connected to the relay module, the fuse module and the electronic control unit by pressure connections instead of welding bus bars to each other. Thus, it is easy to perform a circuit connection operation. Further, it is possible to solve the problem of warping of the bus bars, which occurs due to the thermal strain to which the bus bars are subjected when they are welded together.

The pressure connection terminals at the ends of each of the bus bars, connected to terminals of the relays of the relay module respectively, are preferably arranged in parallel with one another and connected respectively by pressure connection to the conductors, which are parallel in the connector module. This construction allows the connection between the circuit of the relay module and that of the connector module to be accomplished in a one-time pressure connection operation.

The relay module may be of a direct mounting type. That is, the relay may be mounted on a body having a bus bar formed by insert moulding. A terminal of the relay penetrates through apertures formed in the body and the bus bar, and the terminals of the relay may then be soldered to the bus bar. This construction allows the height of the relay to be kept to a minimum. Thereby it is possible to make the junction box thin.

The preferred layout of the junction box would have the connector module mounted in the lower portion of the casing, the fuse circuit portion located laterally of the connector module at a first side of the casing, the relay circuit portion located above the connector module at the first side of the casing, an electronic control unit mounted in the casing above the connector module, the connector accommodation portion of the casing, to receive at least one electrical connector, in use, located at a further side thereof, extending orthogonally to the first side thereof, and the bus bars of the connector module project into the connector accommodation portion to constitute tabs therein for connection to the connector, in use.

According to a third aspect of the invention there is provided an electrical junction box having an electrical circuit adapted to make electrical connection, in use, to electrical connectors, fuses and relays. The electrical circuit comprises a fuse connection circuit, a relay connection circuit and a connector connection circuit, which is electrically connected to the fuse connection circuit and the relay connection circuit. At least one of either the fuse connection circuit, the relay connection circuit and the connector connection circuit comprises a circuit module having a plurality of elongate bus bars arranged parallel to each other and extending in a first direction. A plurality of flexible conductors arranged parallel to each other and crossing the bus bars are arranged in a second direction, orthogonal to the first direction, where the flexible conductors and the bus bars are electrically connected to each other at a plurality of their mutual crossing points to provide the desired circuit connections.

The layout allows the side surface of the junction box to be effectively utilised. Thereby it is possible to make the junction box thin.

Conventionally, a conductive metal plate is punched in a shape corresponding to the configuration of a circuit to form an electric conductor. But according to this aspect of the present invention, the desired circuit can be formed by crossing the elongate bus bars and the flexible conductors and connecting them to each other at necessary crossing points. Therefore, there is little loss of the conductive metal plate and it is possible to greatly improve the yield of the conductive metal plate. In addition, when it is necessary to change the construction of the circuit, it is not necessary to alter the conductors but it is only necessary to change the position where the bus bars and the flexible conductors are connected to each other. Accordingly, the junction box of the present invention can be manufactured at a low cost and can cope with the alteration of the circuit. At the crossing points, the bus bars and the conductors, e.g. single-core wires, may be joined to each other in openings formed in the insulation substrate by resistance welding or soldering.

In the case where a bare wire is used as the flexible conductor, it is unnecessary to remove an insulating coating at the position where the wire and the bus bar are connected to each other. However, it is possible to use wire having a core wire coated with an insulation coating material. Alternatively, the flexible flat cable described herein above may be used.

Optimally, the wires and the bus bars may be connected to each other by resistance welding in the openings formed in the insulation substrate. However, soldering may be used as described above. In addition, ultrasonic welding, gas welding or laser welding may also be used.

The circuit module may have a plurality of circuit substrates layered one upon another with insulation interposed between the circuit plates adjacent to each other, with each of the circuit substrates having flexible conductors disposed on one surface and elongate bus bars disposed on the other surface.

The invention further provides a method of forming an electrical circuit module comprising the steps of: fixing a plurality of bus bars to a first main surface of each of a plurality of insulation substrates; arranging flexible conductors on a second main surface opposite the first main surface of each insulation substrate, while the insulation substrates are arrayed in a row, with the flexible conductors extending continuously over the insulation substrates in said row; connecting the bus bars to the flexible conductors at mutual crossing points thereof via apertures in the insulation substrates to form desired circuit connections; bending the portions of the flexible conductors that extend between adjacent pairs of the insulation substrates to bring the insulation substrates into a stack one above another; and removing portions of said flexible conductors not wanted in the completed circuit.

By forming the circuit module in the manner described, the flexible conductors may be wired collectively or continuously and operability of the method can be greatly improved.

According to another aspect of the invention, there is provided an electrical junction box having an electrical circuit adapted to make electrical connection, in use, to electrical connectors, fuses and relays. The electrical circuit comprises a fuse connection circuit, a relay connection circuit and a connector connection circuit, which is electrically connected to the fuse connection circuit and the relay connection circuit. The electrical junction box may comprise a connector module providing the connector connection circuit, which comprises an insulation substrate having a first main surface and a second main surface opposite the first main surface, and a plurality of first electrical conductors on the first main surface and a plurality of second electrical conductors on the second main surface. The first electrical conductors are parallel to each other and can extend in a first direction and the second electrical conductors are parallel to each other and extend in a second direction, orthogonal to the first direction. Thus, the second electrical conductors cross the first electrical conductors at crossing points.

The first and second conductors may be selected from the following:

(a) the first electrical conductors are elongate bus bars and the second electrical conductors are flexible conductors of a flexible flat cable comprising flexible insulation material in which the flexible conductors thereof are held, (b) the first electrical conductors are individual flexible single-core wires, and the second electrical conductors are flexible conductors of a flexible flat cable comprising flexible insulation material in which the flexible conductors thereof are held, and (c) both the first and second electrical conductors are flexible conductors of a flexible flat cable comprising flexible insulation material in which the flexible conductors thereof are held. In addition, at a plurality of the crossing points, the mutually crossing first and second electrical conductors may be connected to each other to provide the desired electrical junctions.

In this aspect of the present invention, elongated bus bars and flexible flat cables (FFC) are used. Alternatively, a FFC and a flexible single-core wire (e.g. bare wires) or two FFCs may also be used in place of the bus bars. The conductors on the one surface of the insulation substrate and the conductors on the other surface thereof are crossed and connected to each other, preferably by welding, at necessary cross points to form the desired circuit. Therefore, there is little loss of the conductive metal plate, which greatly improves the yield of the conductive metal plate. In addition, when the construction of the circuit is changed, it is not necessary to alter the electric conductors, instead, only the positions at which the electric conductors are connected to each other need to be changed. Accordingly, the junction box of the present invention can be manufactured at a lower cost and provides easier alteration of the circuit.

In cases where a FFC and single-wire core (bare wire) are used in combination, or where only flexible flat cables are used instead of a bus bar it is unnecessary to remove the insulating coating material at a connection position. The FFC contains the electric conductors arranged in parallel with one another in the insulation film. Thus, it is possible to dispose only one FFC containing a desired number of electric conductors laminated with the insulation film on the insulation substrate and thereby reduce the time and labor required for assembly.

The electric conductors may optimally be connected on the one surface of the insulation substrate and to those on the other surface thereof to each other by resistance welding. However, soldering, ultrasonic welding, laser welding or gas welding may also be used.

The connector module may include a plurality of circuit layers comprising insulation substrates and conductors, stacked one upon another with insulation plates interposed between the adjacent layers. The FFC has the electric conductors laminated with the insulation film. Thus when the bus bar, the single-core wire or the FFC is located at the interface between two layers, they are insulated. In this case, the use of the insulation plate can be omitted.

In this specification the term "pressure connection" refers to the connection of two conductors that is achieved by press-fitting a gripping part onto a gripped part, the fitting force being maintained to keep a permanent connection. In the embodiments, for example, a wire is inserted into a groove on the tab of a bus bar, which maintains a gripping pressure on the wire.

The flexible conductors used in the invention should be selected to be suitably flexible without damage, e.g. to allow the connections through the insulating substrates. Their flexibility is in contrast to the relative rigidity of the bus bars, which generally retain their shape, though being capable of being deformed into a desired shape.

BRIEF DESCRIPTION OF THE DRAWINGS

Embodiments of the invention will now be described by way of non-limitative example, with reference to the drawings, in which.

DETAILED DESCRIPTION OF THE PREFERRED EMBODIMENTS

In the different embodiments, the same reference numbers are used for identical or similar parts.

Figure 1:
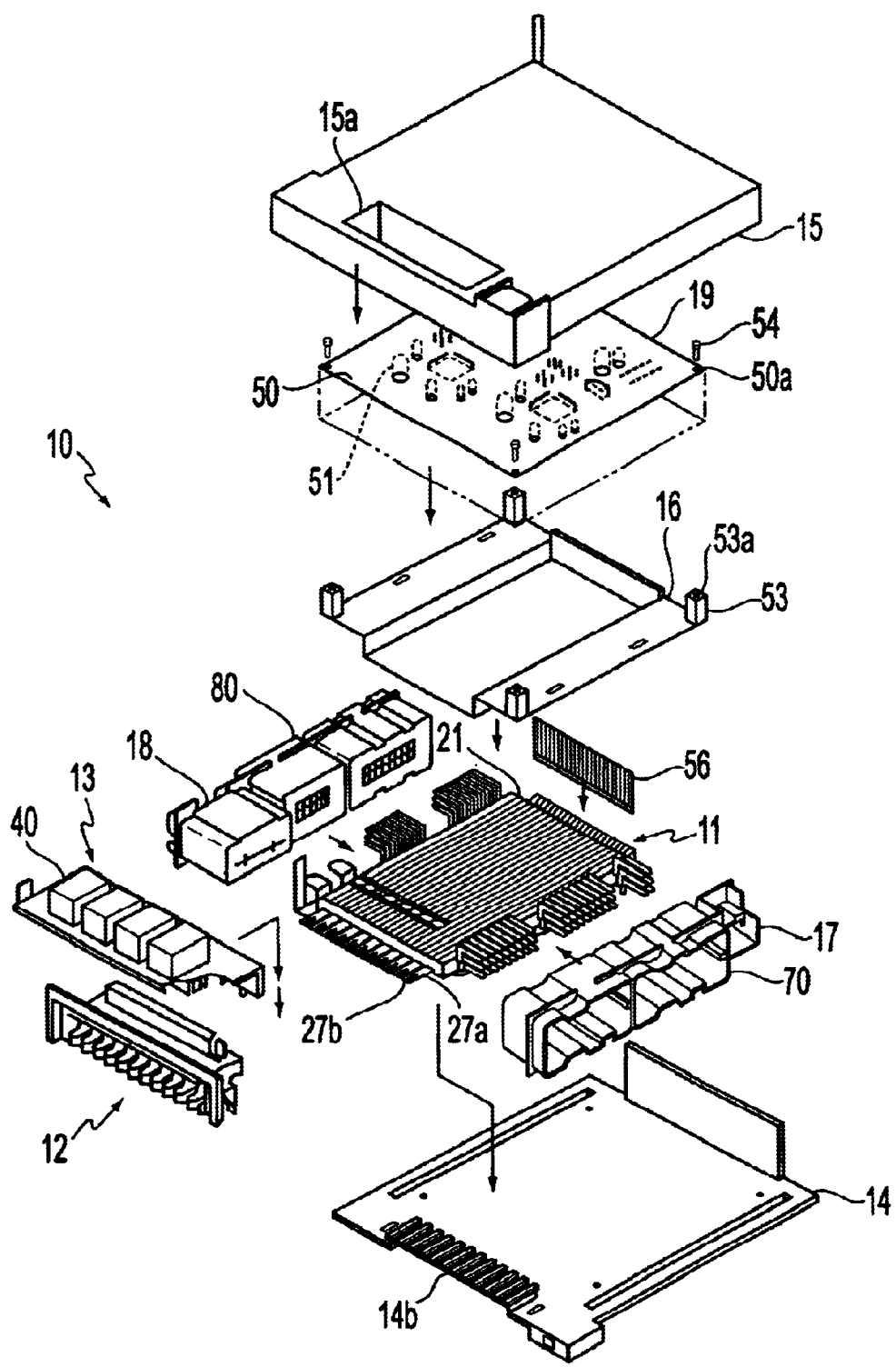
FIG. 1 is a schematic exploded perspective view of a junction box of a first embodiment of the present invention.
Figure 2:
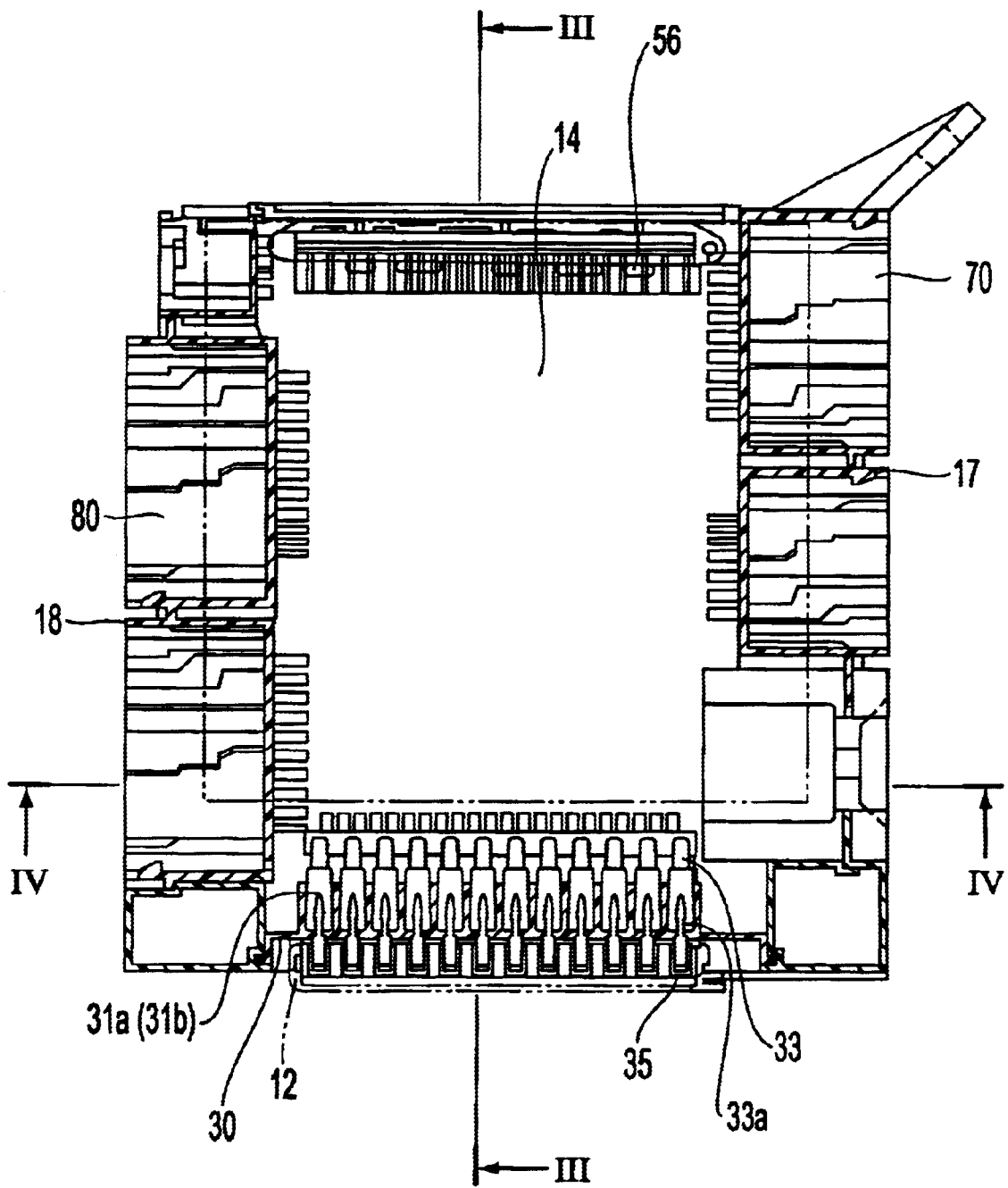
FIG. 2 is a sectional view of the junction box of FIG. 1 in its assembled state.
Figure 3:
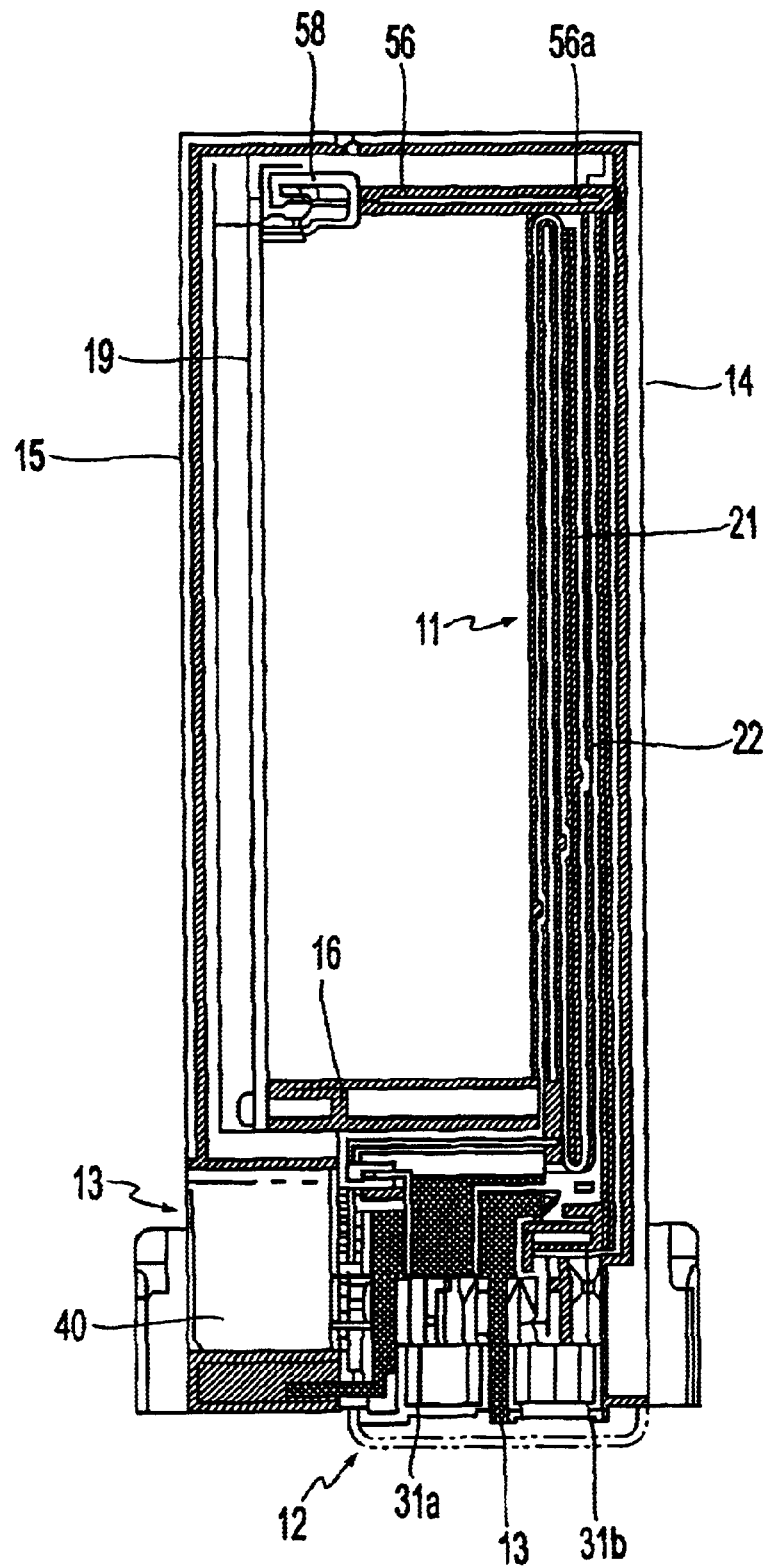
FIG. 3 is a sectional view on line III—III of FIG. 2.
Figure 4:
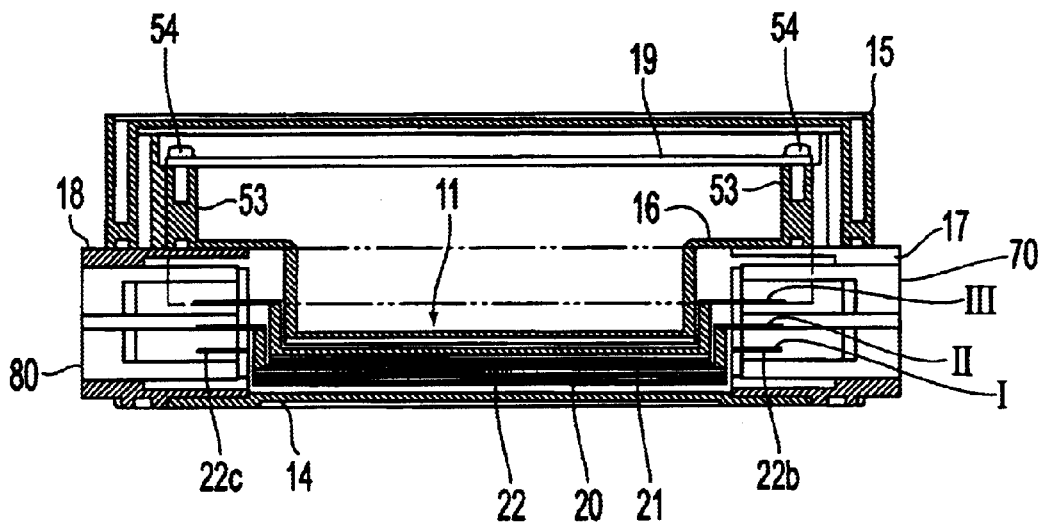
FIG. 4 is a sectional view on line IV—IV of FIG. 2.

FIG. 1 is a schematic exploded perspective view showing component parts constituting an electrical junction box 10 intended to be connected to a wire harness, not shown, in a vehicle, such as an automobile. FIGS. 2 to 4 are sectional views showing the assembled state of the component parts.

The junction box 10 has a connector module 11, a fuse module 12 and a relay module 13, housed in a casing having a lower case 14, an upper case 15, an intermediate case 16 and opposite side cases 17, 18. Within the casing there may also be an electronic control unit 19. The cases 14, 15, 16, 17 and 18 are moulded plastics bodies.

After the connector module 11, the intermediate case 16 and the electronic control unit 19 may be sequentially disposed on the lower case 14, the upper case 15 may be mounted on the electronic control unit 19, and the side cases 17, 18 may be mounted on the connector module 11. The relay module 13 may be disposed over one side of the connector module 12 in such a way as to expose relays 40 of the relay module 13 to the outside through an opening 15a formed adjacent one side of the upper case 15. The fuse module 12 may be mounted on the connector module 11 at one side thereof and exposed to the outside through an opening formed between the lower case 14 and the upper case 15.

Figures 5A, 5B:
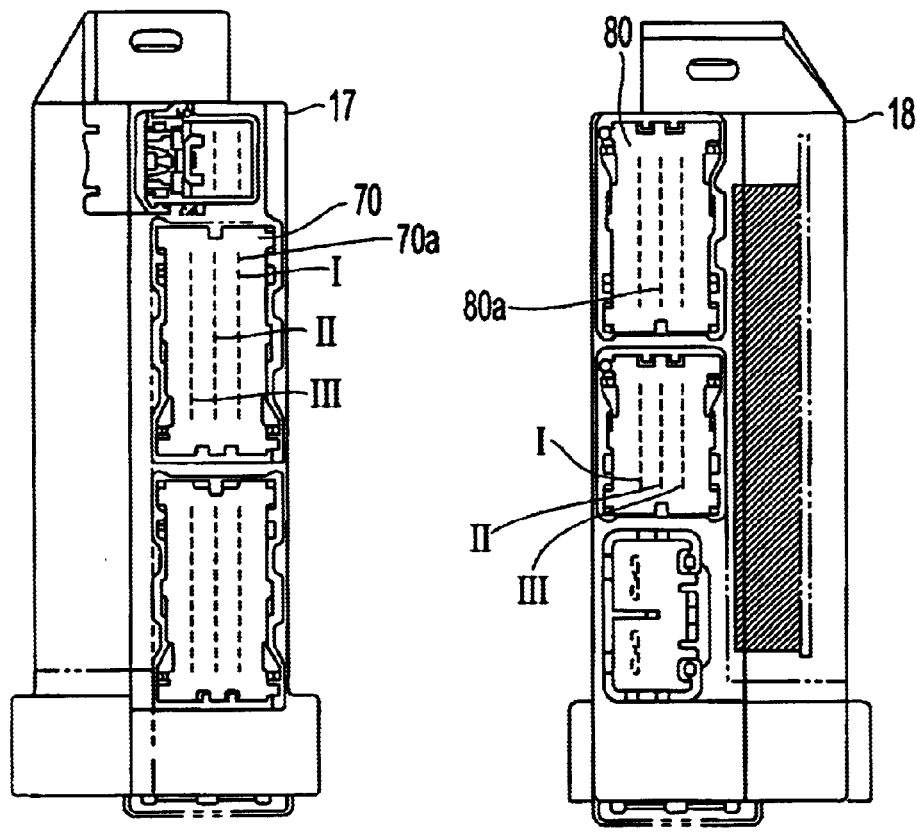
FIGS. 5A and 5B are front views of two side cases of the box of FIG. 1 respectively.

A plurality of connector accommodation portions 70, 80 in the form of receiving sockets may be formed in a row on each of the side cases 17, 18, which may be mounted at opposite sides of the lower case 14 and the upper case 15 in their widthwise direction. As shown in FIGS. 5A and 5B, the number of stages of terminals in each of the connector accommodation portions 70, 80 is three, namely, I, II and III, except at one socket of each where the number of stages of terminals is reduced.

Figure 6A:
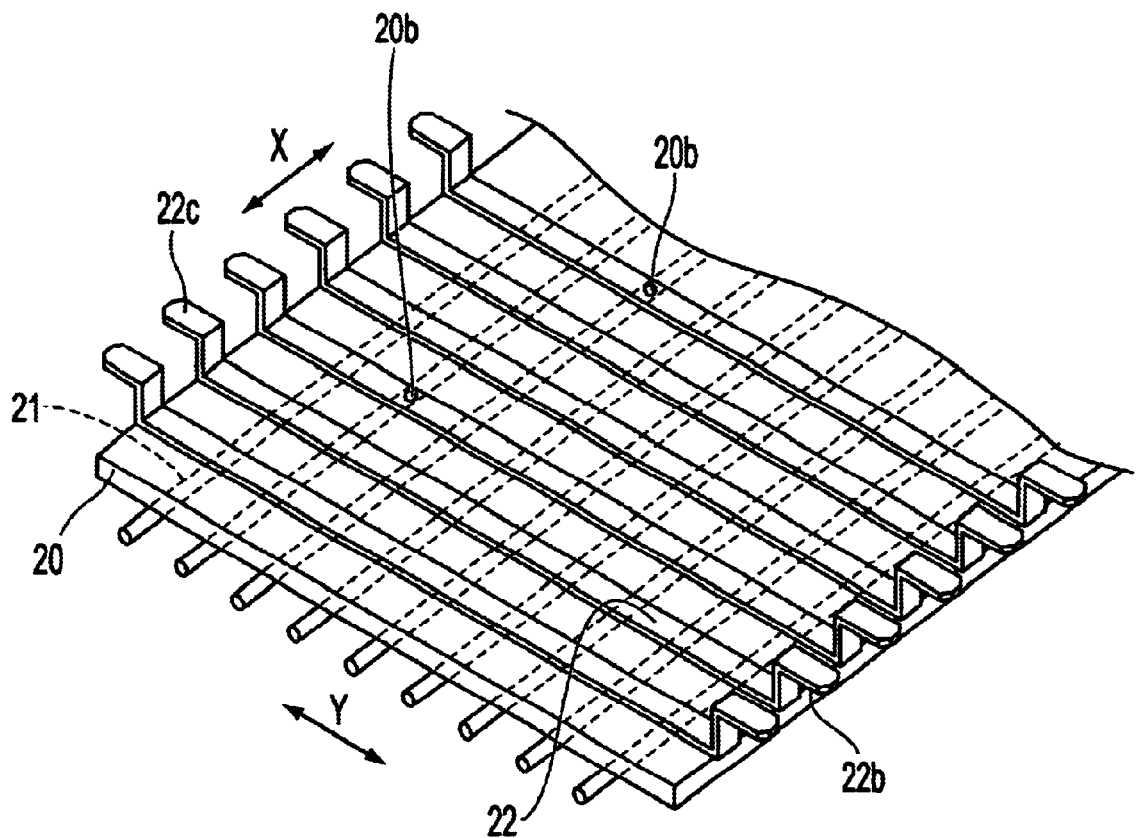
FIG. 6A is a schematic perspective view of a layer of the connector module of the box of FIG. 1.
Figure 6B:
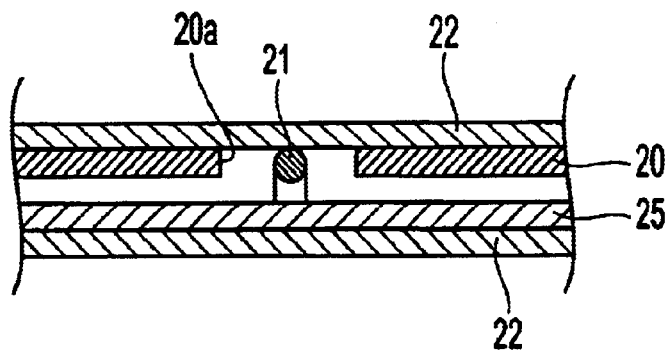
FIG. 6B is an enlarged sectional view showing a portion of the connector module of the box of FIG. 1.

As shown in FIG. 6, in each layer of the connector module 11, flexible single-core wires 21 in the form of bare wires of copper may be disposed entirely on one surface (lower surface in FIG. 5) of a thin planar insulation substrate 20 made of insulation resin in such a way that the single-core wires 21 extend parallel with one another at a regular pitch in an X-direction. Long and narrow bus bars 22 in the form of metal strips of uniform width may be disposed on the other surface (upper surface) of the insulation substrate 20 in such a way that the bus bars 22 are parallel with one another at a regular pitch in a Y-direction orthogonal to the X-direction. That is, the single-core wires 21 and the bus bars 22 cross each other, with the insulation substrate 20 interposed therebetween.

An opening 20a through the substrate 20 may be formed at each of selected positions 20b where the single-core wires 21 and the bus bars 22 cross each other. Through the opening 20a, the single-core wire 21 is flexed to join it to the bus bar 22. In this state, the single-core wires 21 and the bus bars 22 may be selectively welded to each other by resistance welding to form a desired circuit.

The two ends of each bus bar 22 in its longitudinal direction project from the edges of the insulation substrate 20 in its widthwise direction. The projecting portions may be bent twice in a zig-zag shape as shown to form horizontal tabs 22b, 22c. The tabs 22b and 22c may be arranged parallel with one another respectively on the same level.

The interval between the horizontally arranged tabs 22b may be equal to the interval between the adjacent terminal holes 70a of the connector accommodation portion 70 of the side case 17. Similarly, the interval between the horizontally arranged tabs 22c is equal to that between adjacent terminal holes 80a of the connector accommodation portion 80 of the side case 18.

Figure 7A:
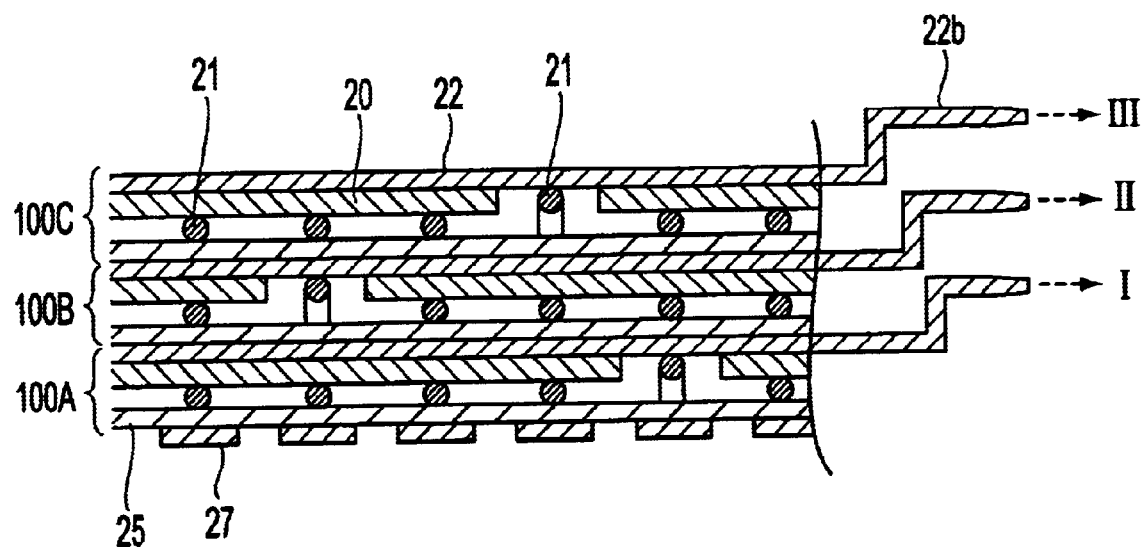
FIG. 7A is a schematic sectional view of the connector module of the box of FIG. 1.

In this manner, a circuit plate 100 may be constructed of the single-core wires 21 and the bus bars 22 disposed as described above and connected to each other at the required positions, with the insulation substrate 20 sandwiched between them. As shown in FIG. 7A, three such circuit plates 100, identified as 100A, 100B and 100C may be layered vertically on each other with interposition of additional insulation plates 25 made of insulation resin. The tabs 22b and 22c of the bus bar 22 of the three circuit plates 100 stacked vertically may be vertically spaced in correspondence to the interval between adjacent rows of the terminal holes 70a, 80a of the connector accommodation portions 70, 80 of the side case 17, 18. That is, the tabs of the bus bars of the circuit plates 100A, 100B and 100C are level with the terminal holes of the first row, the second row and the third row respectively.

Figure 7B:
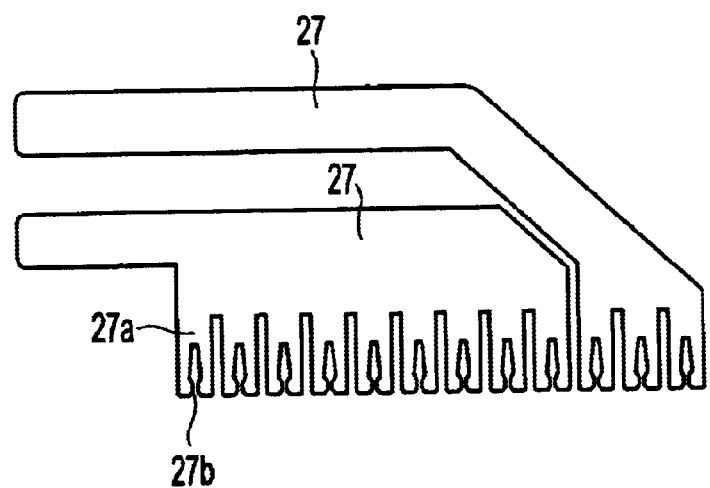
FIG. 7B shows in plan a bus bar at the lowermost layer of the connector module.

In the connector module 11, a bus bar 27, having a circuit configuration formed by punching a conductive metal plate in a conventional manner as shown in FIG. 7b may be disposed on a lower surface of the insulation plate 25 below the first circuit plate 100A. As shown in FIG. 1 also, at one end of the bus bar 27, there may be formed a plurality of fuse connection pressure connection terminals 27a arranged parallel with one another and projecting in the extension direction of the single-core wires 21. The terminals 27a project from an edge of the module 11 as blades 27b which are brought into contact with terminals of fuses in the fuse module 12.

The three circuit plates 100A, 100B, 100C to be stacked in three layers may be formed by a method shown in FIG. 8.

Initially, a rib or spigot (not shown) projecting from one surface of each of the respective insulation substrates 20 may be inserted into an opening formed in each of its bus bars 22 and deformed to fix the bus bars to the insulation substrate 20 parallel to each other.

In this case, the width W (see FIG. 8B) of the insulation substrates 20 may be set to the following relationship: 100A>100B>100C. The length of the bus bar 22 may be larger than the width of the insulation substrate 20. The bus bars 22 project from both sides of the insulation substrate 20 in its widthwise direction. The projecting portion of each bus bar 22 may be bent vertically and then bent horizontally to form the horizontal tabs 22b, 22c.

Figure 8A:
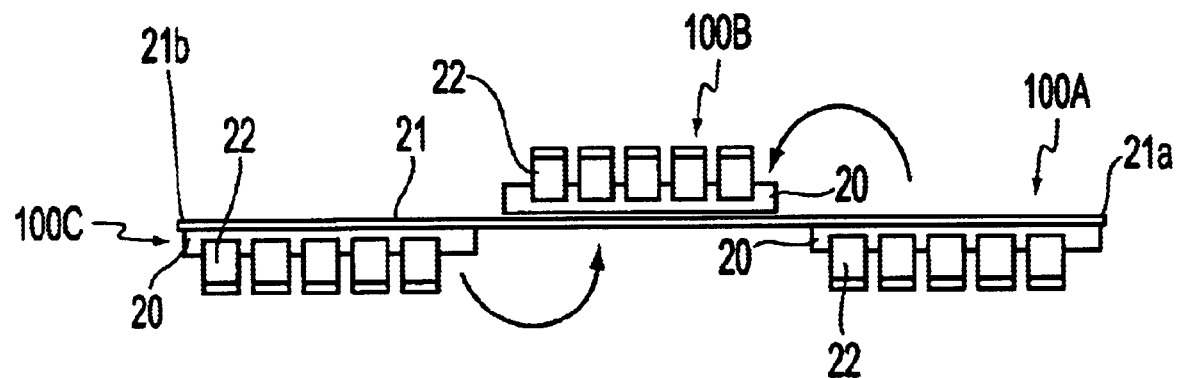
FIGS. 8A and 8B are explanatory diagrams showing a method of forming the connector module of the box of FIG. 1.
Figure 8B:
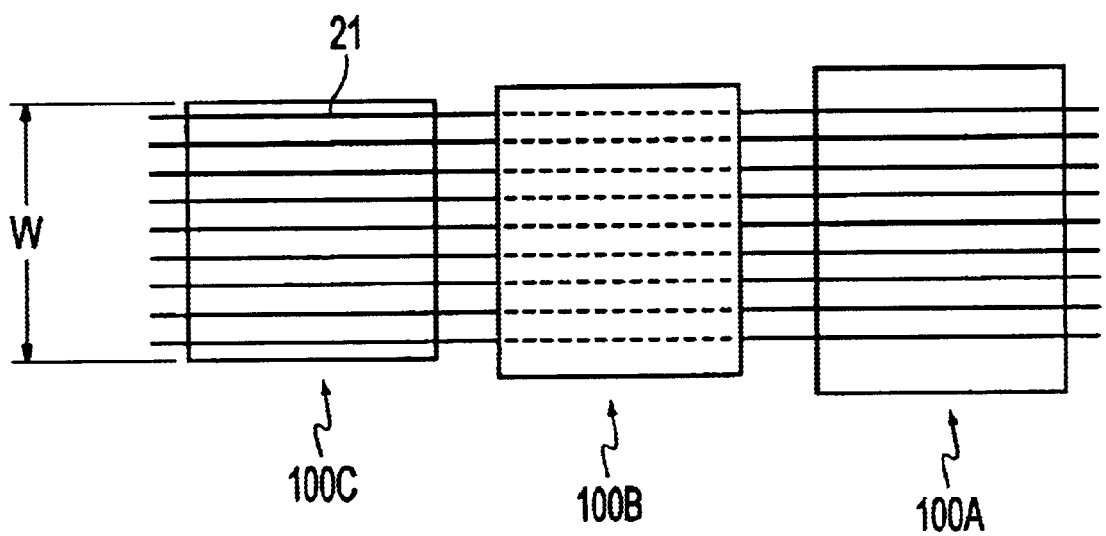

The three insulation substrates 20 are arranged in a row spaced at required intervals, with the middle substrate 20 inverted with respect to the outer two substrates 20, as shown in FIG. 8A.

Thereafter, the single-core wires 21 are continuously extended parallel with one another across the three insulation substrates 20. Because the surfaces to which the bus bars are fixed are alternately inverted, as described above, each single-core wire 21 may be continuously disposed across the upper surface of the substrate 20 in the circuit plate 100A, the lower surface thereof in the circuit plate 100B, and the upper surface thereof in the circuit plate 100C. Gaps may be provided between the adjacent substrates 20 in the row, and the wires 21 extend in parallel with one another in the gaps (see FIG. 8B).

Thereafter, the bus bars 22 and the single-core wires 21 may be joined with each other by resistance welding through the openings 20a. The wires 21 at the gaps between the substrates may then be flexed, to bring the substrates 21 into their stacked positions, as shown by arrows in FIG. 8A. Unwanted portions of the continuous wires 21 may be cut off before and/or after the circuit plates 100A–100C are stacked one upon another. Portions of the bus bars may also be removed.

This manufacturing method is simple, with a small number of operations.

As described above, the fuse connection terminals 27a project parallel with one another from the lowermost end of one edge (left edge in FIG. 1) of the connector module 11. In mounting the connector module 11 on the lower case 14, the terminals 27a may be disposed on a portion 14b formed at one edge (left edge in FIG. 1) of the lower case 14 having partitions to hold the terminals 27a in position. The single-core wires 21 of each circuit plate 100 may be disposed above the pressure connection terminals 27a.

Figure 9:
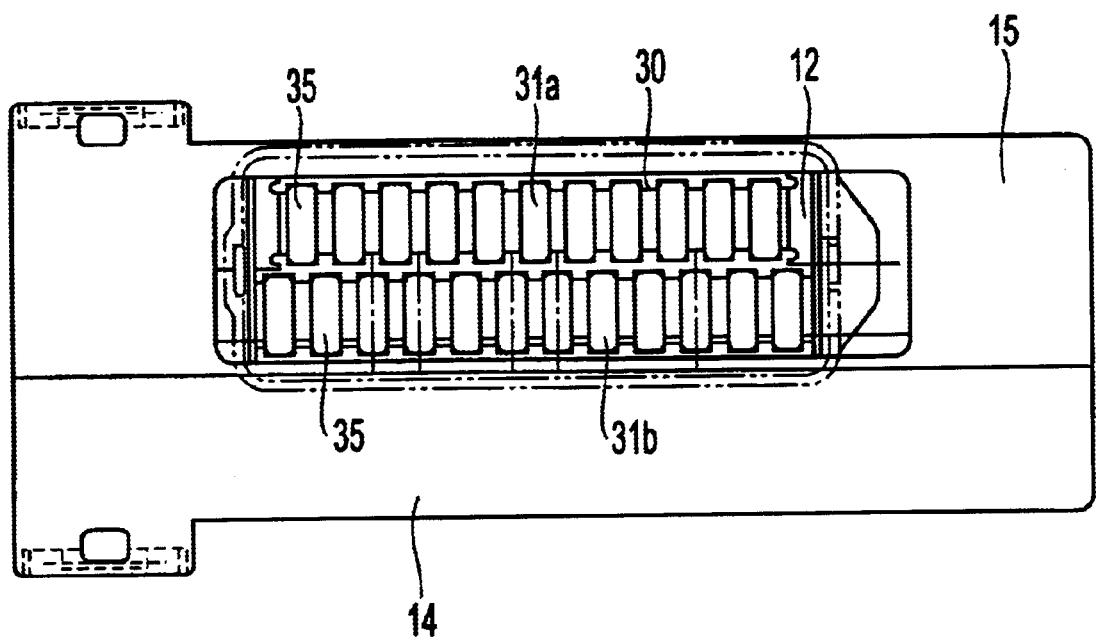
FIG. 9 is a side view of the junction box of FIG. 1 showing the fuse module.

The fuse module 12 may be disposed at the left edge of the connector module 11. As shown in FIG. 9, the fuse module 12 has a plurality of fuse accommodation portions 31 in the form of sockets arranged widthwise in parallel with one another in a moulded plastics body 30. The sockets 31 may be in upper and lower stages.

Figure 10A:
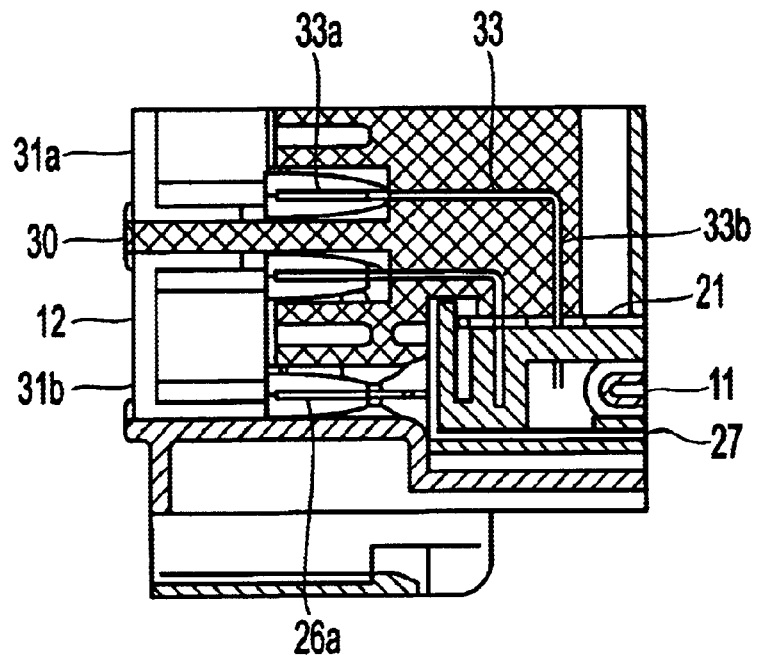
FIG. 10A is a partly sectional view of the fuse module of FIG. 9.

As shown in FIG. 10, bus bars 33 are insert moulded in the material of the body 30. At opposite ends of each bus bar 33, there is formed a pair of pressure connection terminals 33a, 33b. A pair of such terminals projects into each fuse accommodation portion 31a at the upper stage of the fuse module 12 as power supply side and load side terminals. A load side terminal formed on another bus bar 33 projects into each fuse accommodation portion 31b at the lower stage of the fuse module 12. One end of each L-shaped bus bar 33 projects into the respective fuse accommodation portion 31a, 31b, whereas the other end thereof extends toward the upper surface of one of the single-core wires 21. The pressure connection terminal 33b may be connected to the required single-core wire 21 by pressing the wire into the slot of the terminal. The pressure connection terminal 33a projected into the fuse accommodation portions 31a, 31b may be connected to the terminal of the fuse also by pressure. In the lower stage fuse accommodation portion 31b, the terminals at the power supply side are the pressure connection terminals 27a of the bus bar 27 described above.

A fuse 35 may be inserted into the fuse accommodation portions 31a, 31b of the fuse module 12 to connect a pair of terminals 35a, 35b of the fuse 35 to a pressure connection terminal 33a of the bus bar 33 or the pressure connection terminal 27a formed on the bus bar 27 at the lowermost layer of the connector module 11 by press fitting.

Figure 12A:
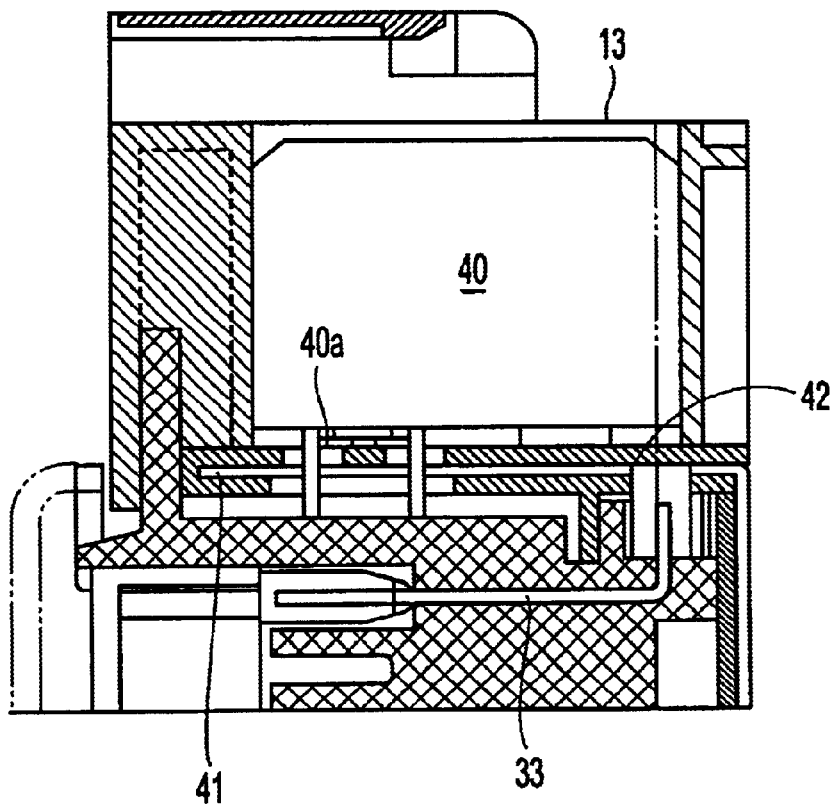
FIG. 12A is a sectional view of the relay module of FIG. 11.
Figure 12B:
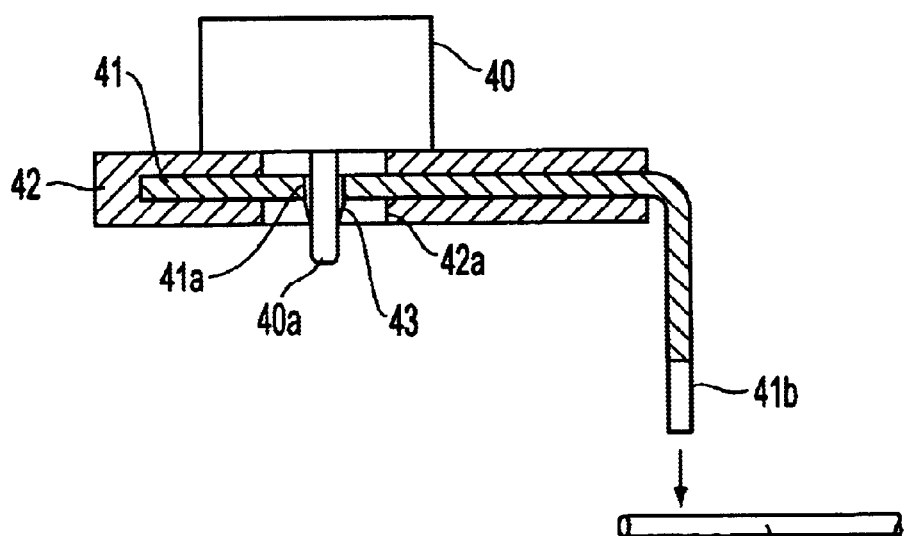
FIG. 12B is a schematic view showing the connections of the relay module of FIG. 11.
Figure 12C:
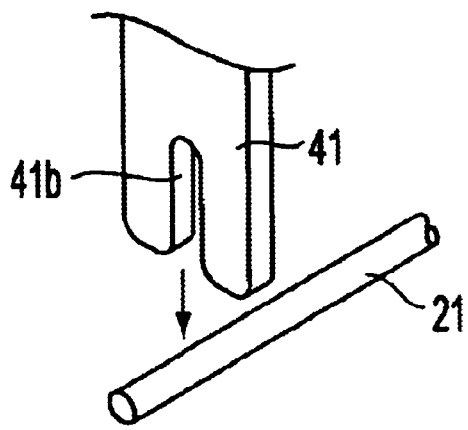
FIG. 12C is a schematic perspective view of a connection between a bus bar and a wire in the relay module of FIG. 11.
Figure 12D:
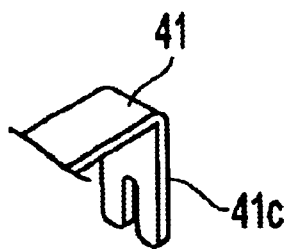
FIG. 12D is a schematic perspective view of a connection between bus bars in the relay module of FIG. 11.
Figure 12D:
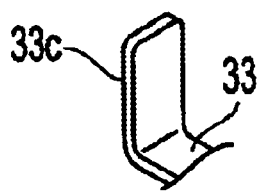

As shown in FIG. 12D, some of the bus bars 41 may be directly connected to tabs 33c of the bus bars 33 of the fuse module 12 by pressure connection.

Figure 11:
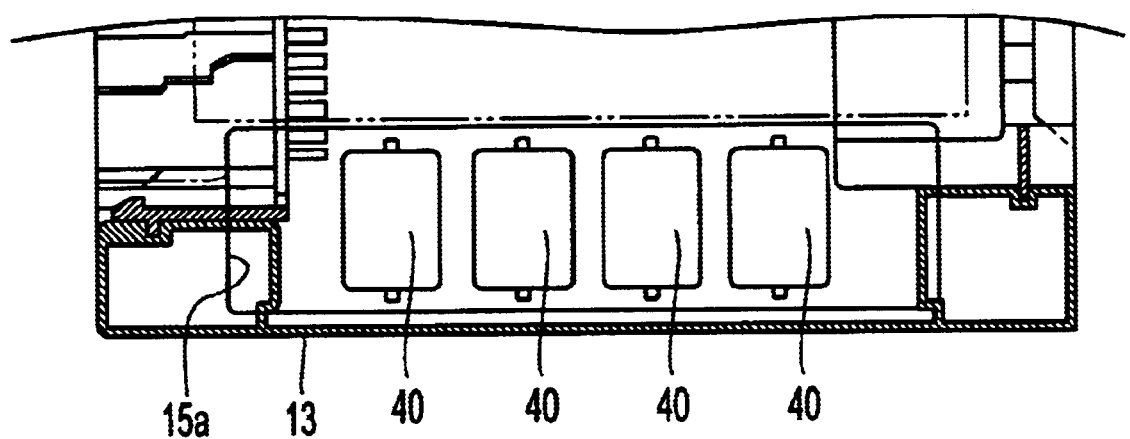
FIG. 11 is a plan view of a portion of the box of FIG. 1 showing the relay module.

In the relay module 13, as shown in FIGS. 11 and 12, bus bars 41 may be insert moulded in the plastics material of the moulded body 42. Relays 40 may be received on the outer face of the body 42. Terminals 40a of the relay 40 may be inserted into openings 42a and 41a in the body 42 and the bus bar 41 respectively and directly mounted on the body 42 with solder 43.

As shown in FIGS. 12B and 12C one portion of the bus bar 41 welded to the terminal 40a of the relay 40 may be bent to form a pressure connection terminal 41b at the front end of the bus bar 41. The terminal 41b may be connected to one of the single-core wires 21 by pressure fitting.

The electronic control unit 19 has electronic parts 51 mounted on a lower surface of a substrate 50. The substrate 50 may be placed on supports 53 projecting upwardly at four corners of the intermediate case 16. Screws 54 may be screwed into screw holes 53a and 50a formed in an upper surface of the support 53 and the substrate 50 respectively to fix the substrate 50 to the intermediate case 16. In this state, the electronic parts 51 may be located in a space between the substrate 50 and the intermediate case 16.

A plurality of printed electric conductors arranged in parallel with one another at one edge of the substrate 50 may be connected to the upper end of a vertically extending assembly of relay terminals 56 through an ECU connector 58 (FIG. 3) or directly. Pressure connection terminals may be formed at the lower end of the relay terminals 56 to connect with single-core wires 21 of the connector module 11 by pressure fitting.

In the junction box 10 composed of the above-described component parts, the connector module 11, the intermediate case 16 and the electronic control unit 19 may be stacked one upon another sequentially on the lower case 14. The electric conductors of the electronic control unit 19 may be connected to the single-core wires 21 of the connector module 11 through the relay terminals 56 by pressure connection. The fuse module 12 may be mounted on the connector module 11 at one side thereof to connect the pressure connection terminals 33b disposed at one end of the bus bars 33 of the fuse module 12 to the single-core wires 21 of the connector module 11. The relay module 13 may be mounted on an upper part of the connector module 11 to connect the pressure connection terminals of the bus bars 41 of the relay module 13 to the single-core wires 21 of the connector module 11.

In the junction box 10 having the above-described construction, the tabs 22b, 22c formed at the ends of each of the bus bars 22 of the connector module 11 project into the terminal holes of the connector accommodation portions 70, 80 of the side cases 17, 18 and in use make connection to connectors (not shown) of a wire harness (not shown).

Because the connector may be connected to the wire harness on the side surface of the junction box, it is unnecessary to connect the wire harness to the horizontal surface of the lower case 14 or the upper case 15. Thus it is unnecessary to provide space for the wire harness below the lower case or above the upper case. Accordingly, it is possible to reduce the space required in the vehicle for the wire-harness connection.

Figure 22A:
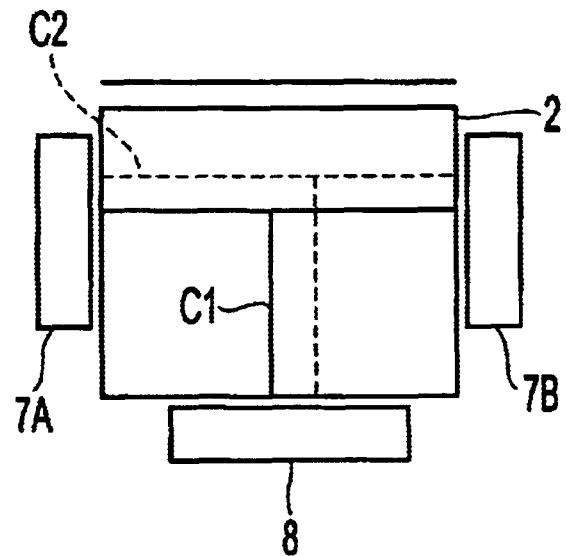
FIGS. 22A and 22B are diagrams comparing a conventional junction box (FIG. 22A) and a box of the present invention (FIG. 22B).
Figure 22B:
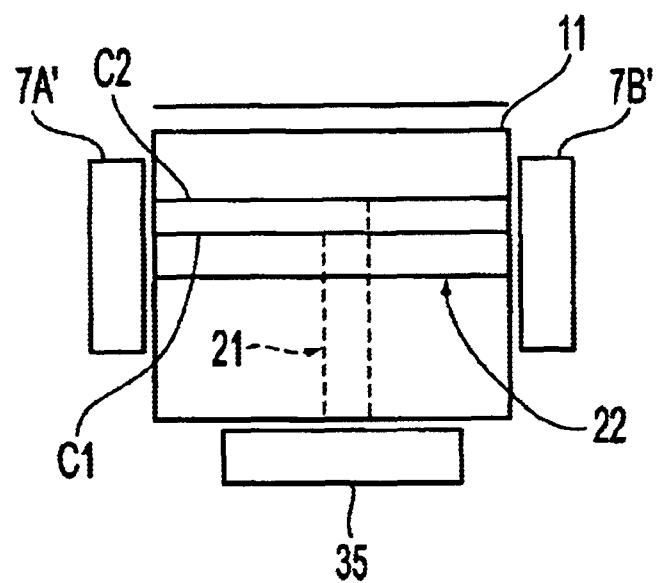

As shown schematically in FIG. 22B, the electrical conductors of the connector module 11 are the bus bars and the single-core wires crossing the bus bars. The single-core wires and the bus bars may be connected to each other by resistance welding at the required crossing positions to form a circuit. Thus the connector module 11 can be connected to a connector and a fuse without increasing the number of layers of the bus bars.

To form the bus bars 22, it is not necessary to punch a conductive metal plate in correspondence to the specific configuration of a circuit. Standard uniform width strip metal may be used. Therefore, it is possible to greatly improve the yield of the conductive metal plate. In addition, it is easy to alter the construction of the circuit by changing the positions where the bus bars 22 and the single-core wires 21 may be welded to each other.

The use of the flexible wires 21 allows thermal stress at the welding locations to be absorbed.

The electrical conductors of the connector module may be connected to those of the fuse module and the relay module by connecting the pressure connection terminals at the ends of the bus bars of the fuse module and the relay module to the single-core wires 21 of the connector module 11 collectively (in a single operation) by pressure fitting, instead of by welding of bus bars. Therefore, it is possible to reduce the number of welding operations and hence improve ease of manufacture.

Figure 13:
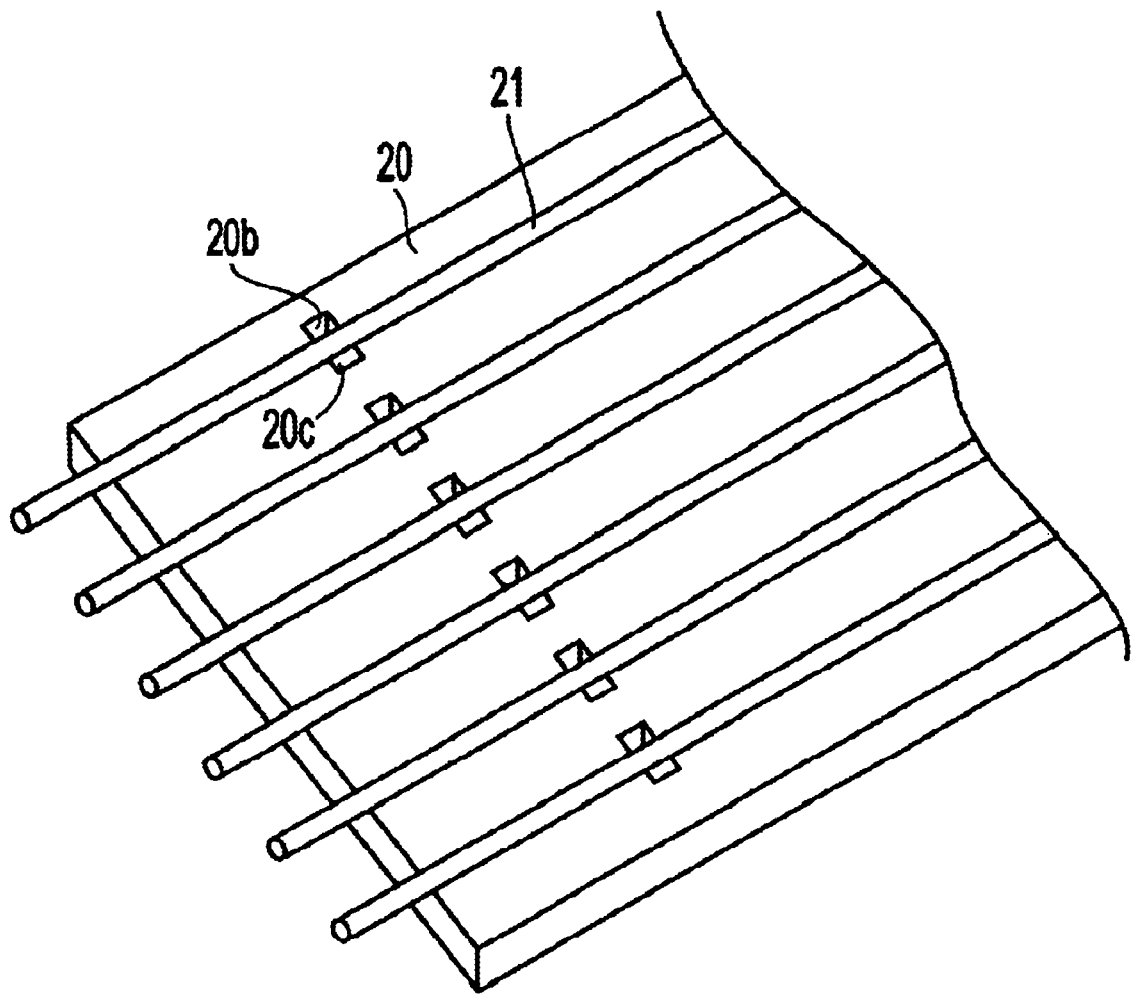
FIG. 13 is a schematic perspective view of a portion of a modified connector module for the box of FIG. 1.

In the modified connector module shown in FIG. 13, in the uppermost circuit plate 100A, near one edge of the insulation substrate 20, a pair of holes 20b and 20c for insertion of pressure connection blades may be formed at positions on both sides of each single-core wires 21. The pressure connection terminals of bus bars of the relay module 13, described above, may be connected to an intermediate portion of the single-core wires 21 of the circuit plate 100A, by inserting the blades of the terminals inserted into the holes 20b and 20c.

As shown in FIG. 13, the electric conductors (bus bars) of the relay module can be connected to the intermediate portions of the single-core wires 21 by pressure connection. Thereby it is possible to connect the circuit of the connector module to that of the relay module by pressure connection, instead of welding of bus bars.

Because the relay module may be connected to the intermediate portions of the single-core wires 21, it is possible to utilize both ends of the single-core wires for pressure connection between the wires and other modules, namely, the bus bars of the fuse module and also for pressure connection between the wires and the electronic control unit.

In addition, simplification can be achieved by connecting the circuit of the relay module, the fuse module and the electronic control unit to the same single-core wire of the conductor module.

Because the connector module has the largest number of circuits and requires many variations of its circuit construction, wires and bus bars may be used as the electric conductors thereof. They may be crossed and welded to each other at selected crossing positions to form the desired circuit thereof. Therefore, it is possible to achieve easy alteration of the circuit construction by merely changing the positions where the bus bars and the single-core wires may be connected to each other.

The present invention is not limited to the above-described embodiments. For example, the tab formed at both ends of the bus bars may project into the terminal hole of the connector accommodation portion, with the tab being flat and not bent.

Figure 14A:
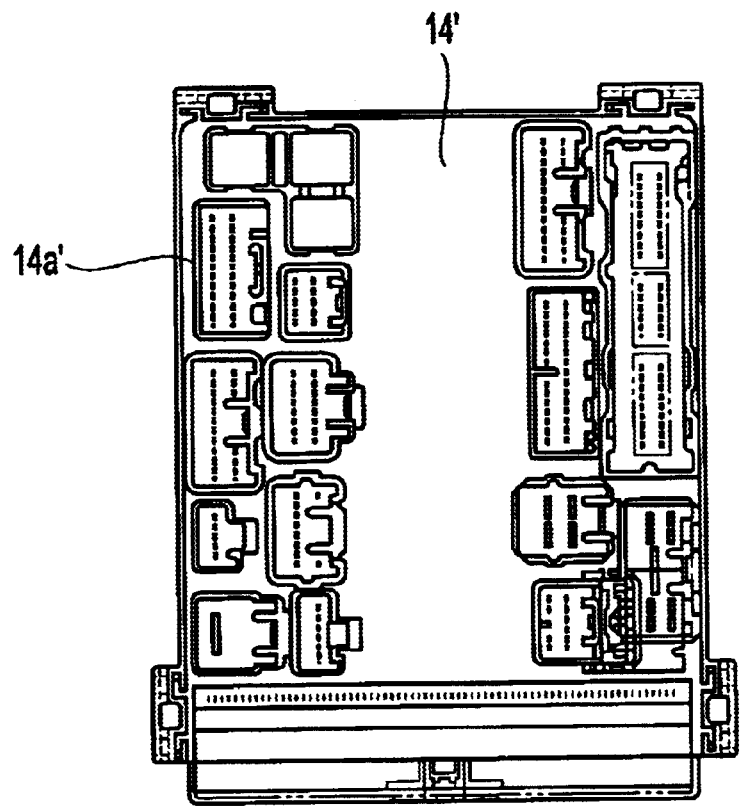
FIG. 14A is an underneath view of an electrical junction box which is a second embodiment of this invention.
Figure 14B:
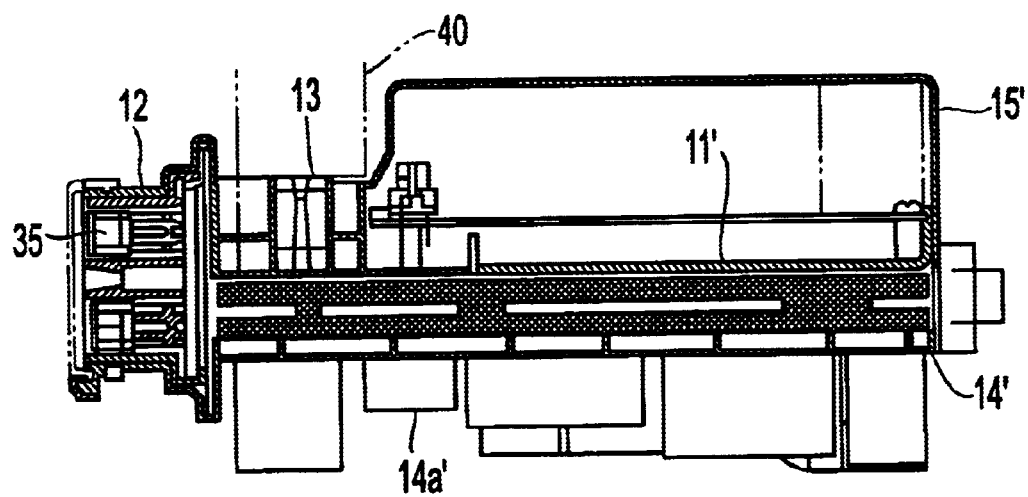
FIG. 14B is a sectional view of the box of FIG. 14A.
Figure 15:
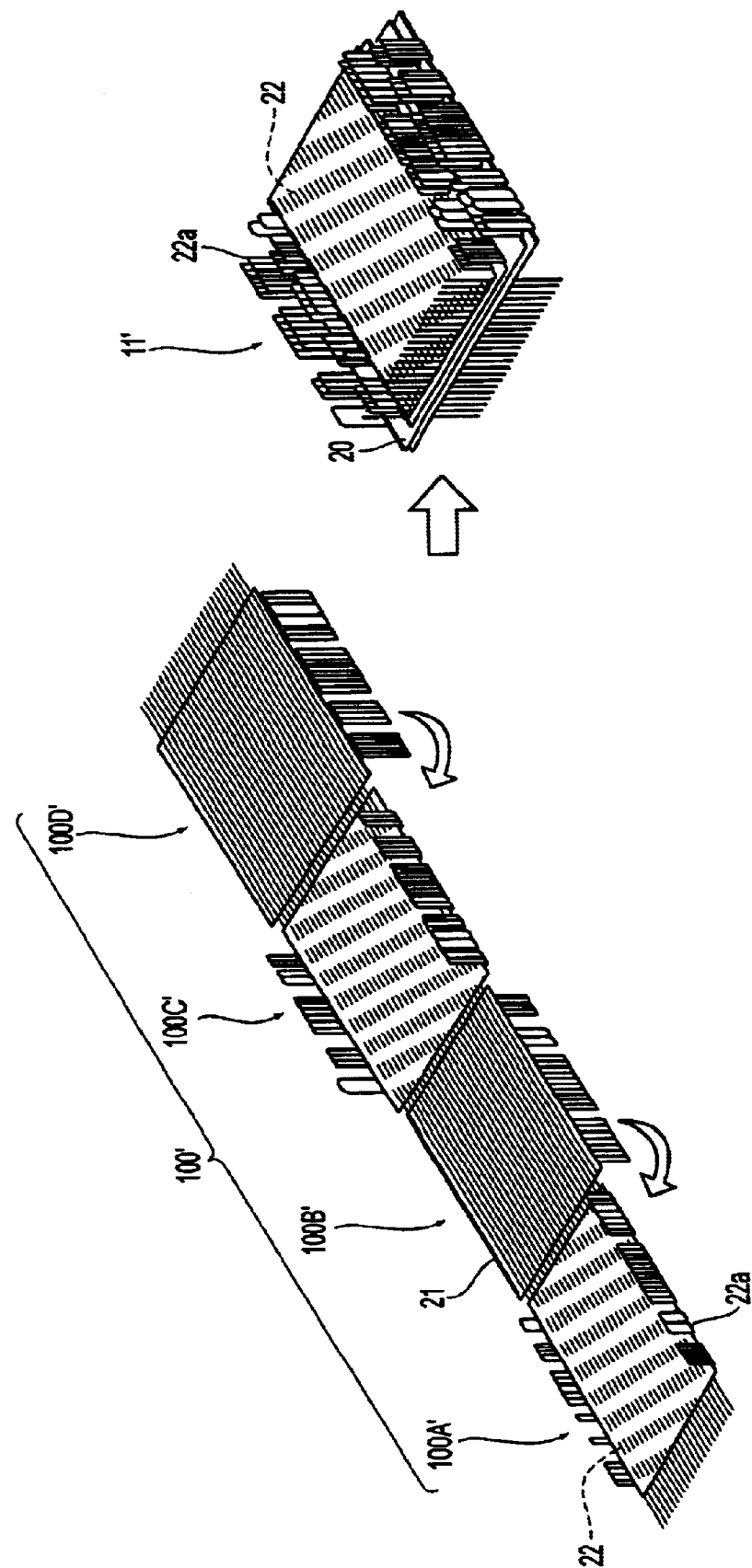
FIG. 15 is a diagram showing the construction of the connector module of the box of FIGS. 14A and 14B.

FIG. 14 shows a further modification of the junction box of FIG. 1. Instead of using the side cases having the connector accommodation portions, the casing may be constructed of an upper case 15' and a lower case 14' in which connector accommodation portions 14a' may be formed. In this case, as shown in FIG. 15, the tabs 22a of the bus bars 22 of the connector module 11' may be bent downward with respect to the insulation substrate 20.

In the above embodiments, single-core wires may be used in the connector module. Instead, it is possible to use a single-core wire coated with an insulation coating material. In this case, the insulation coating material may be removed at the locations where the wire and the bus bar are welded to each other.

It is possible in the fuse module and the relay module to use circuits like the connector circuit described above having bus bars disposed on one surface of the insulation substrate and the electrical wires disposed on the other surface thereof, to connect to the fuse terminals and relay terminals.

As apparent from the foregoing description, in the illustrated junction box of the present invention, as the electric conductors of the connector module, the long and narrow bus bars and the single-core wires are arranged crossing each other, with the insulation substrate interposed between them and welded to each other at crossing points to form the circuit of the connector module. Therefore, it is possible to insert the tabs at both ends of the bus bars into the terminal holes of the connector accommodation portions formed on the side cases. Further the gap between the bus bars is equal to the gap between the terminal holes. In addition, the gaps between the tabs of the bus bars in the respective layers of the stack of circuit plates is equal to the spacing between the rows of the terminal holes of the connector accommodation portions. Thereby by making the number of the circuit plates layered one upon another is equal to the number of the rows of the terminals of the connector accommodation portions and by using the long and narrow strip bus bars, it is easy to form the connector accommodation portions without bending the bus bars in a complicated manner.

Further since the connectors may be received at the side surface of the case of the junction box, the bus bars do not need to be arranged in a complicated manner. The long and narrow strip bus bars are arranged parallel with one another in a simple manner.

Furthermore, by the use of the long and narrow bus bars, it is possible to reduce the manufacturing cost considerably, as compared with the case in which the bus bars are formed as complicated shapes in correspondence to the configuration of a circuit. Thus when a re-design of the circuit is needed the construction of the present invention can achieve alteration of the circuit construction by merely changing the position of connection between the wires and the bus bars.

Further variations of the connector module 11 will now be described.

Figure 16A:
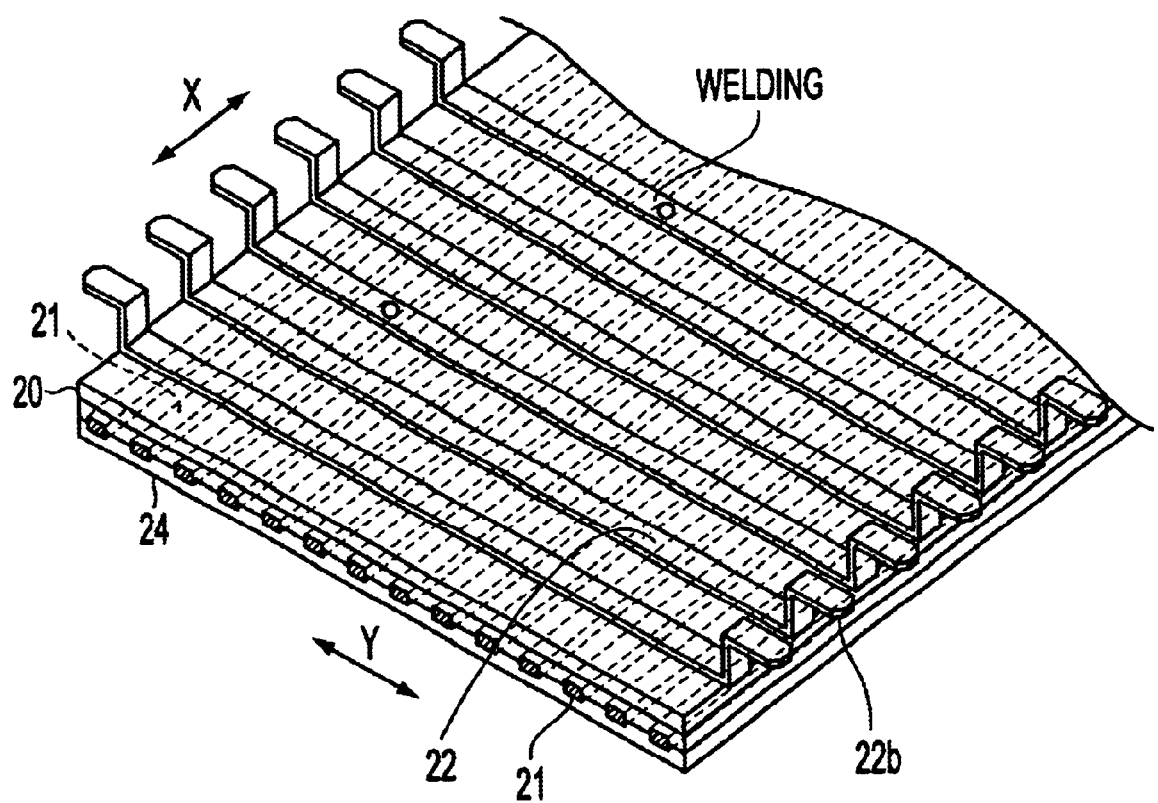
FIG. 16A is a schematic perspective view of a layer of a modified connector module for the box of FIG. 1.
Figure 16B:
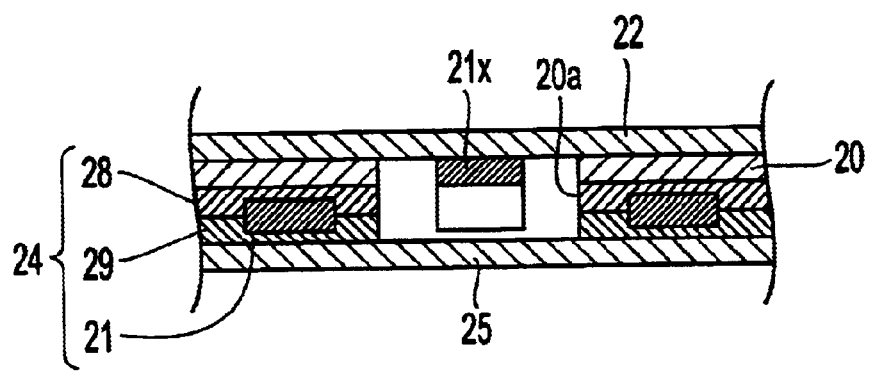
FIG. 16B is a schematic sectional view of the layer of FIG. 16A.
Figure 17:
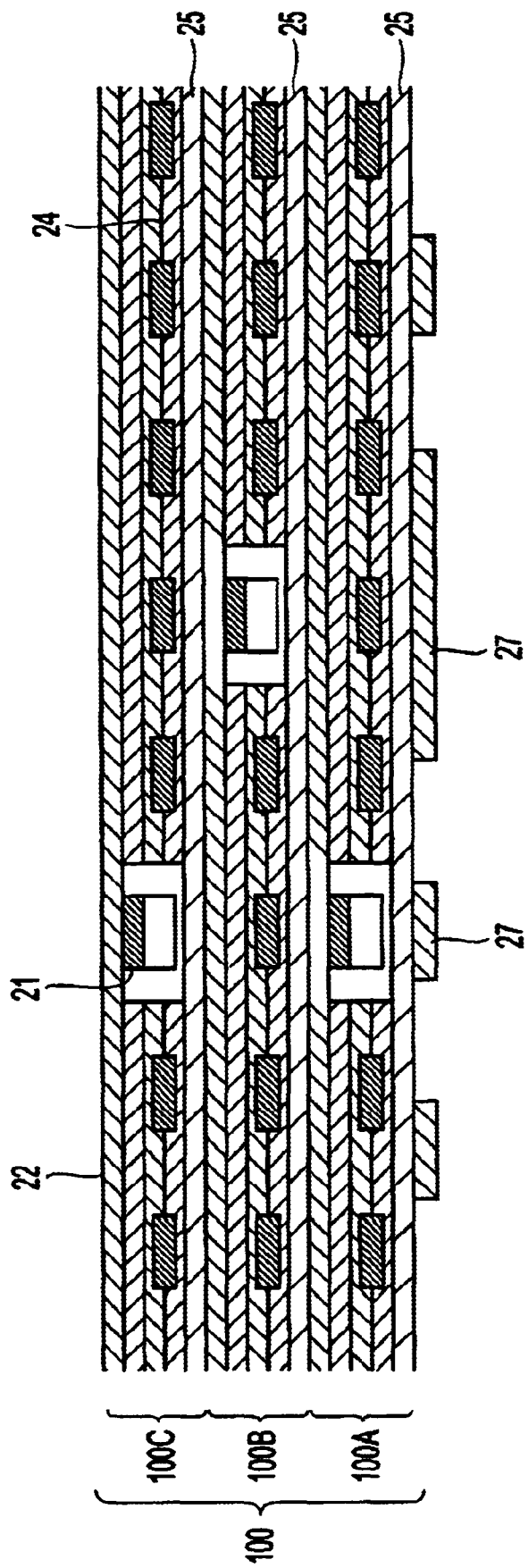
FIG. 17 is a sectional view illustrating the assembly of the layers of FIG. 16 of the modified connector module.

In the modified connector module of FIGS. 16A, 16B and 17, flexible wires in the form of sectionally rectangular electrical conductors 21 consisting of copper may be disposed on one surface (lower surface in FIG. 16) of the thin insulation substrate 20 made of insulation resin in such a way that the electric conductors 21 are parallel with one another at a regular pitch in the X-direction. Upper and lower surfaces of the conductors 21 may be laminated with insulation films 28, 29 to form a wide flexible flat cable (FFC). Elongate bus bars 22 may be disposed on the other surface (upper surface) of the insulation substrate 20 in the same manner as shown in FIG. 6 etc. above. The electric conductors 21 of the FFC 24 and the bus bars 22 cross each other, with the insulation substrate 20 interposed therebetween.

As shown in FIG. 16B, an opening 20a is formed at each of selected positions where the conductors 21 and the bus bars 22 cross each other. At each hole, the insulation films 28, 29 of the FFC 24 are separated from the conductor 21 to expose the conductor 21, which may be flexed through the opening 20a of the insulation substrate 20. In this state, a flexed portion 21x of the conductor 21 and the bus bar 22 may be welded to each other by resistance welding to form a required circuit connection of the FFC 24 and the bus bars 22.

In this manner, a circuit plate 100 (100A–100C) is constructed of the FFC 24 and the bus bars 22 disposed as described above and connected to each other at the required positions, with the insulation substrate 20 sandwiched therebetween. As shown in FIG. 17, three circuit plates 100 are layered vertically on each other through insulation plates 26 made of insulation resin.

In this connector module, as shown in FIG. 17, a bus bar 27, having a circuit configuration formed by punching a conductive metal plate may be disposed on a lower surface of the lower circuit plate 100A through an insulation plate 25, as in the above embodiment.

The three circuit plates 100 (100A–100C) disposed in three layers may be formed by the method shown in FIG. 8, substituting the array of wires 21 of FIG. 8 by the single FFC 24 which may be laid across the three substrates.

Portions of the conductors 21 which are not wanted in the circuit of the continuous FFC 24 may be cut off before and/or after the circuit plates 100A–100C are layered one upon another.

In the layered state, the FFC 24 may be disposed on the lower surface of the insulation substrate 20, and the bus bars 22 may be disposed on the upper surface thereof, with the insulation substrate 20 interposed between the FFC 24 and the bus bars 22. Between the adjacent circuit plates 100A–100C, the FFC 24 and the bus bars 22 confront each other, with the insulation plates 26 interposed therebetween.

Figure 10B:
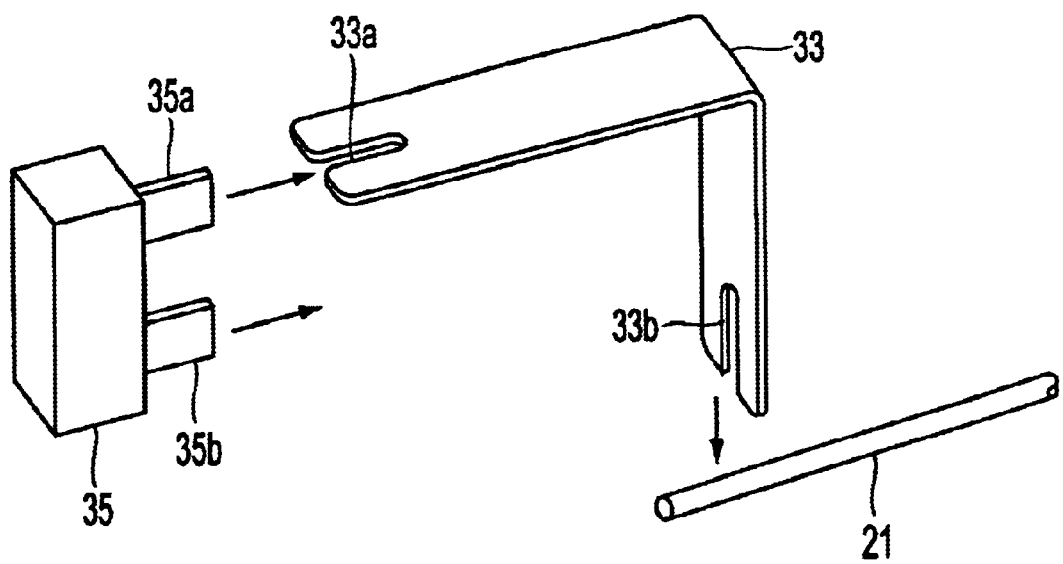
FIG. 10B is a schematic perspective view of the connections of the fuse module of FIG. 9.
Figure 18A:
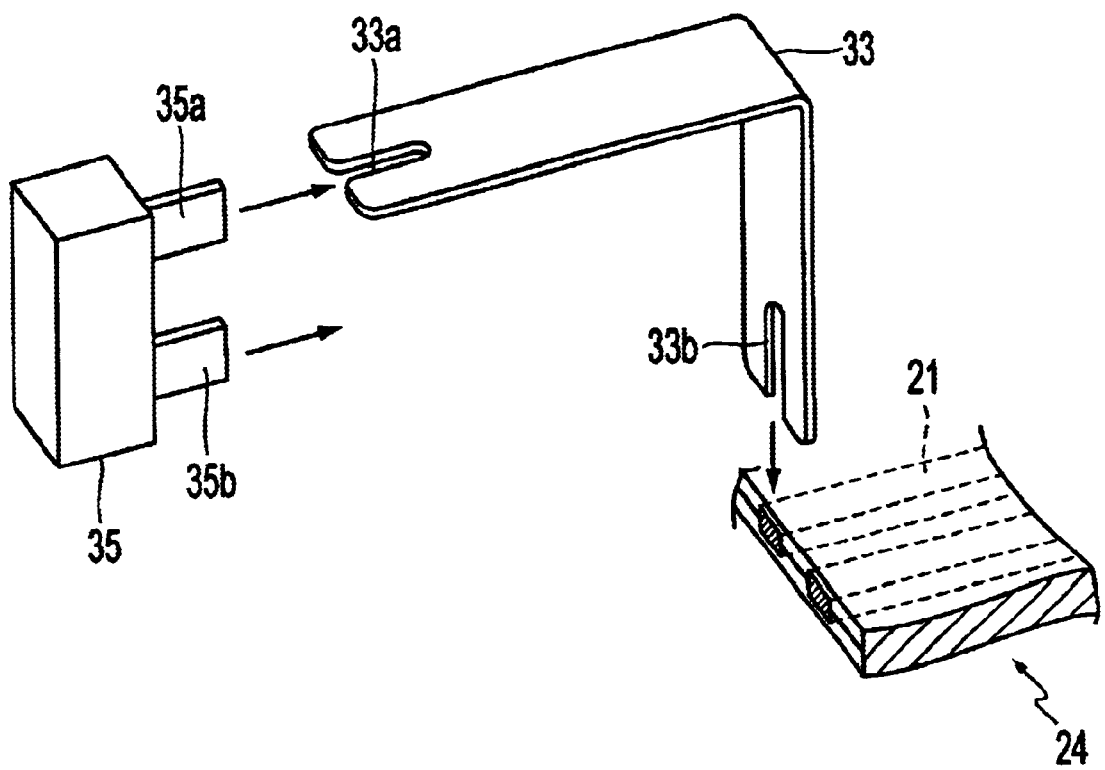
FIGS. 18A and 18B are schematic views of connections in the fuse module, when the modified connector module of FIGS. 16 and 17 is employed.
Figure 18B:
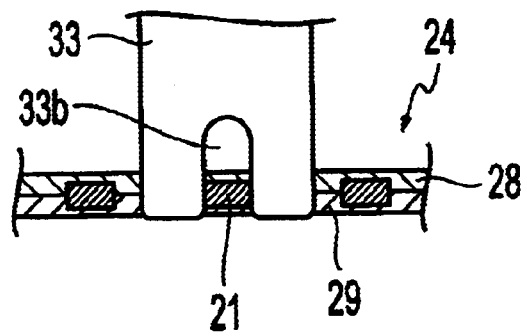
Figure 19:
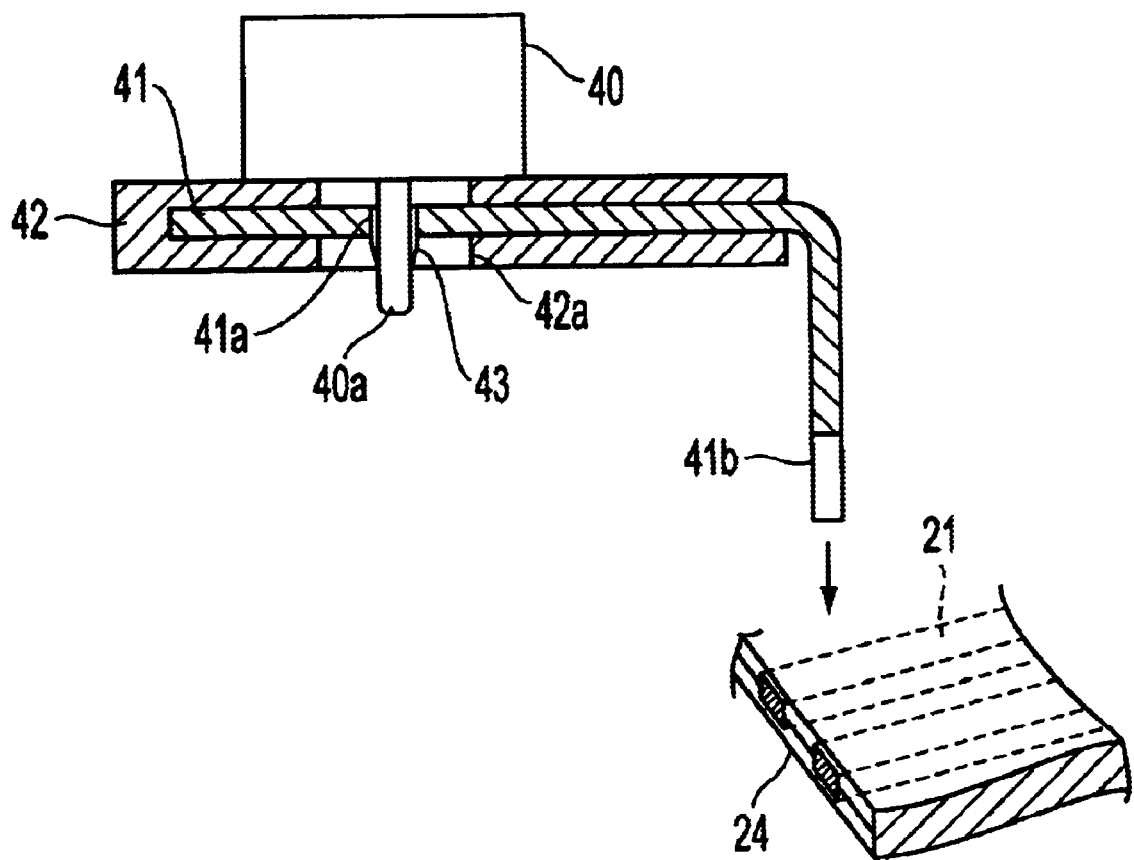
FIG. 19 is a schematic view of a connection in the relay module, when the modified connector module of FIGS. 16 and 17 is employed.

FIG. 18 shows how, in a manner similar to that of FIG. 10B, the pressure connection is made between the bus bars 22 of the fuse module and the conductors 21 of the FFC 24. It is not necessary to remove the insulation 22, 23 before pressing the bus bar 33 and the FFC 24 together. FIG. 19 likewise shows the pressure connection made between the bus bars 41 of the relay module and the conductors 21 of the FFC 24.

The connections of the FFC 24 to the electronic control unit via the relay terminals 56 may also be carried out by pressure connections.

Figure 20A:
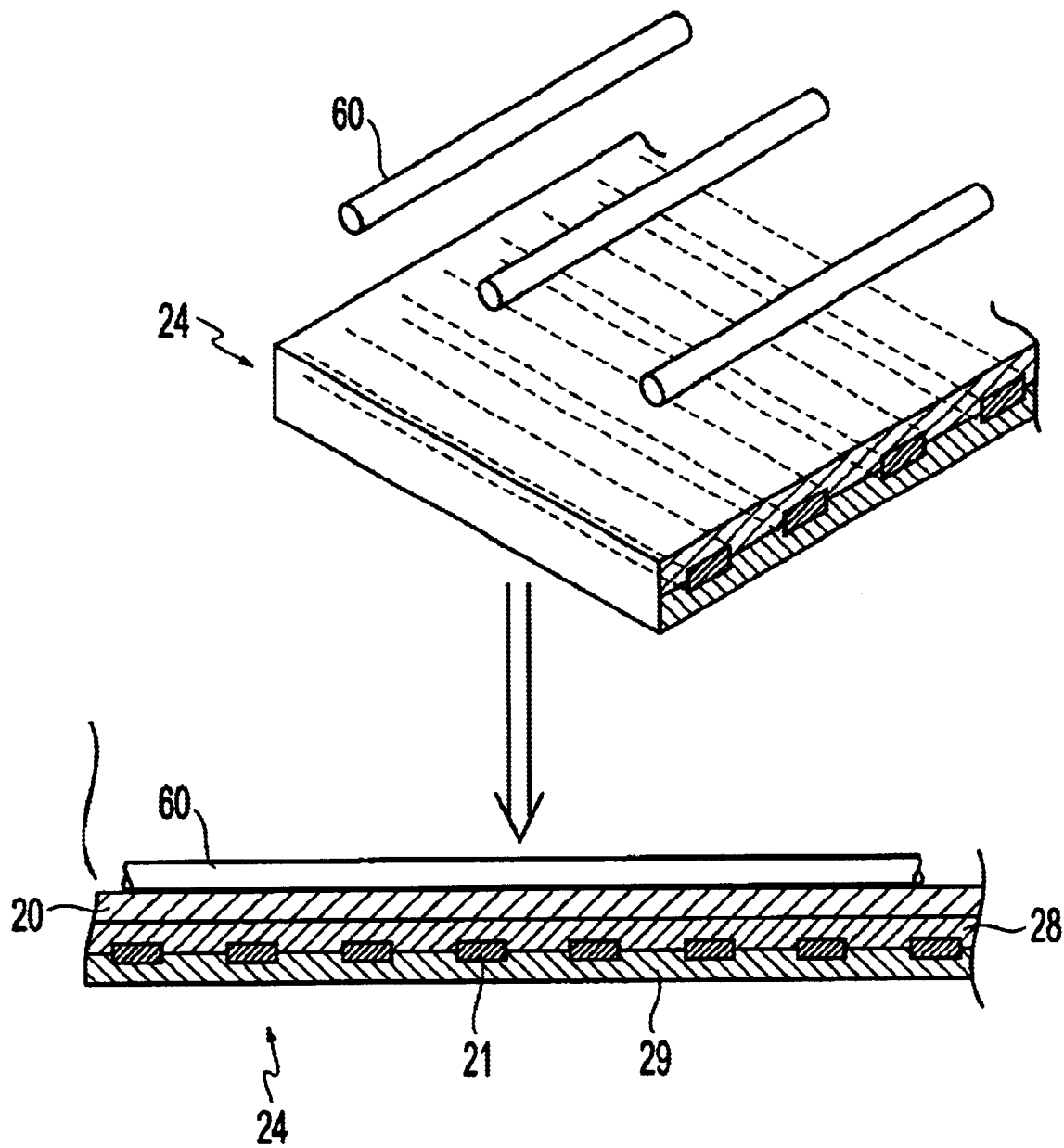
FIGS. 20A and 20B are diagrams illustrating manufacture of other forms of modified connector modules for the box of FIG. 1.
Figure 20B:
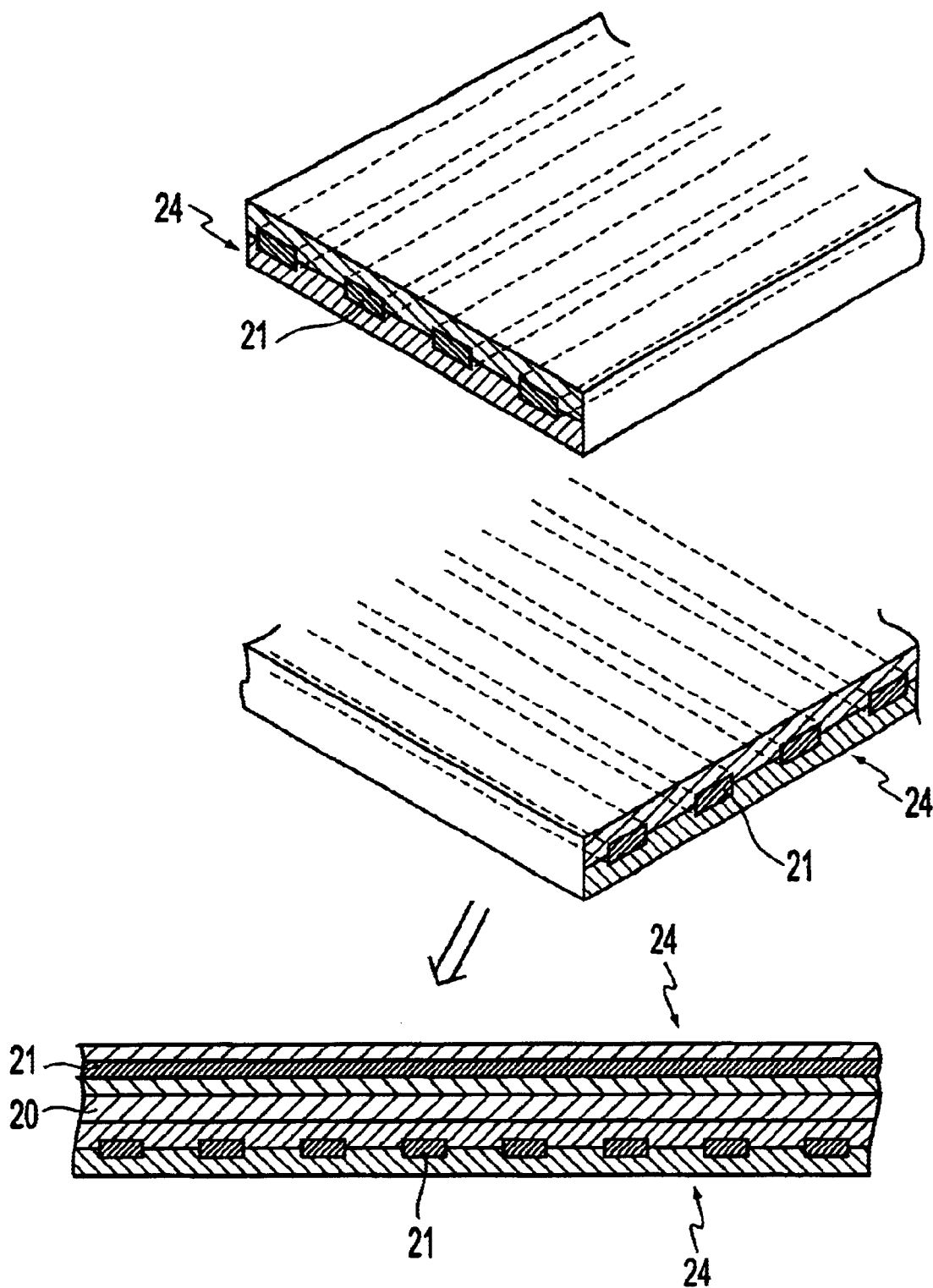
Figure 21:
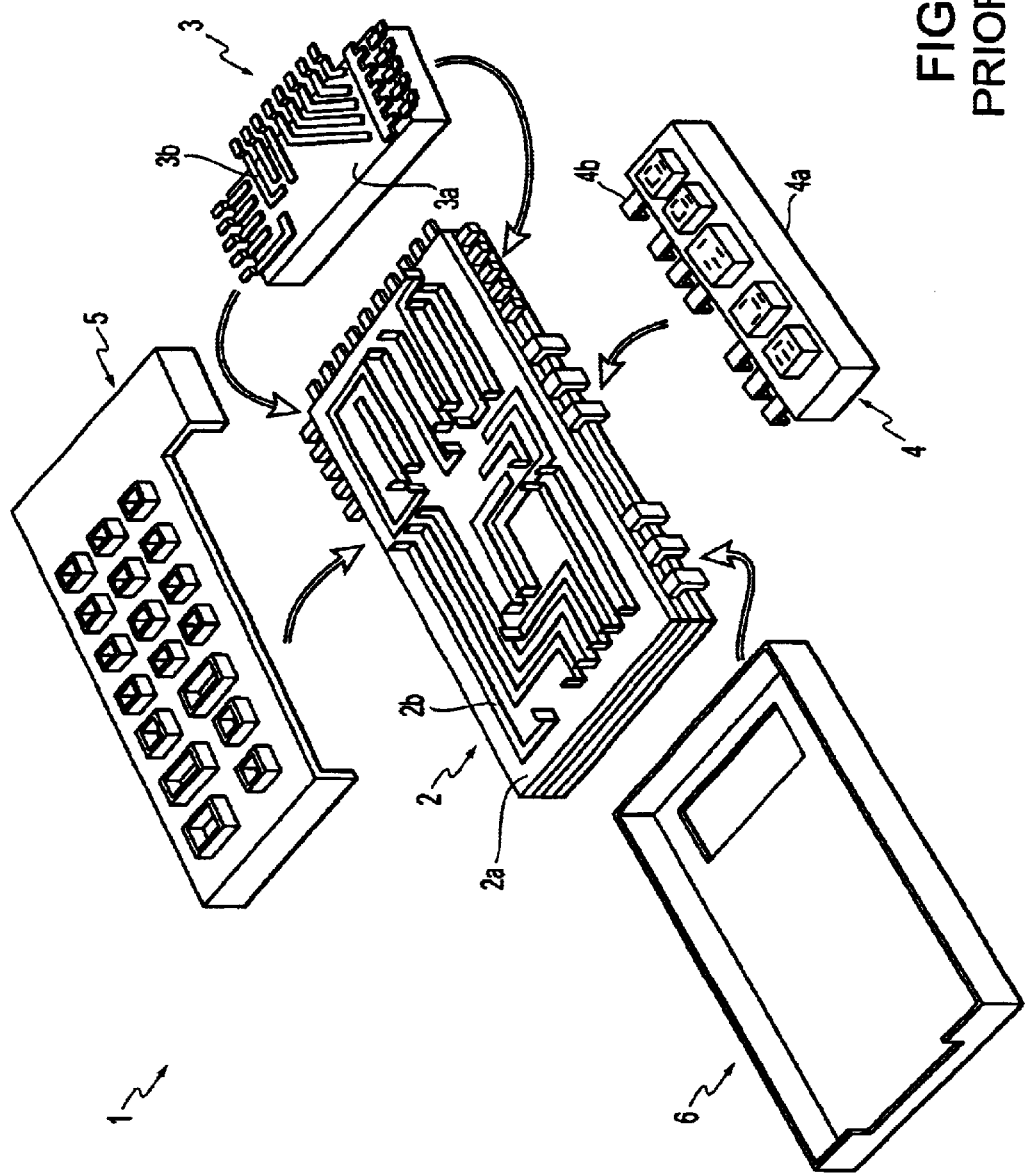
FIG. 21 is an exploded perspective view of a prior art junction box.

FFC 24 may be used in other versions of the connector module 11. For example, as shown in FIG. 20A, in the connector module, flexible single-core wires 60 similar to the wires 21 of FIG. 6 may be disposed on one surface of the insulation substrate 20 and the FFC 24 may be disposed on the other surface thereof. Alternatively, FFCs may be disposed on both surfaces of the insulation substrate 20 as shown in FIG. 20B. In both cases, the electrical conductors on the two surfaces of the insulation substrate 20 are orthogonal to each other and cross each other. The electrical conductors may be connected at selected crossing points by bending and/or welding.

It is also possible to have the FFC project into the connector accommodation portion, instead of the tabs of the bus bars, to connect the conductors of the FFC to a connector at a wire harness side.

Furthermore the FFC may be used as a wire harness by extending the FFC from the connector module, namely to connect it to other component parts of the vehicle body. That is, the FFC may be extended outside the junction box to serve as an external harness.

From this embodiment it is apparent that, in the junction box of the present invention, because the connector module has the largest number of circuits and requires alteration of its circuit configuration, electric wires, elongate bus bars, and the FFC (or FFC and electric wires or only FFC) may be used as the electric conductors thereof. The electric conductors cross and may be welded to each other at crossing positions to form the circuit. When the FFC is used the bus bars do not necessarily have to be used.

The FFC can be very easily disposed continuously on one surface of the insulation substrates with the insulation substrates arranged in a row, thus simplifying the manufacture.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

What is claimed is:

1. An electrical junction box comprising:
   a casing, and
   an electrical circuit in said casing adapted to make electrical connection, in use, to electrical connectors, fuses and relays, said electrical circuit comprising a fuse connection circuit, a relay connection circuit and a connector connection circuit which is electrically connected to said fuse connection circuit and said relay connection circuit,
   said casing comprising a fuse circuit portion containing said fuse connection circuit and a relay circuit portion containing said relay connection circuit,
   said electrical junction box further comprising, mounted in said casing, a connector module providing said connector connection circuit and comprising
      (i) at least one insulation substrate having a first main surface and an opposite second main surface, and
      (ii) a plurality of spaced parallel flexible conductors arranged on said second main surface,
   wherein said relay connection circuit comprises a plurality of bus bars having first ends arranged to make connection, at least, in use, to relays and second ends constituting pressure-connection terminals which are connected by pressure connection directly to intermediate points of at least some of said flexible conductors of said connector module.

2. An electrical junction box according to claim 1, wherein said bus bars of said relay connection circuit are bent 90° between said first and second ends thereof and arranged so that said second ends extend towards said main surface of said insulation substrate.

3. An electrical junction box according to claim 1, wherein said bus bars of said relay connection circuit are parallel to each other.

4. An electrical junction box according to claim 1, wherein said connector module comprises a plurality of said insulation substrates stacked one on another and each having a plurality of parallel elongate bus bars arranged on said first main surface thereof, said bus bars and said flexible conductors extending in mutually orthogonal directions and wherein each said insulation substrate has a plurality of apertures through it from said first main surface to said second main surface, said bus bars and said flexible conductors being connected to each other at said apertures by welding to provide desired circuit connections.

5. An electrical junction box according to claim 1, wherein relays are mounted in said relay circuit portion, said relay circuit portion is a molded body, said bus bars of said relay connection circuit are held in said relay circuit portion by insert molding, and said relays have terminals extending through apertures of said molded body and soldered to said bus bars of said relay connection circuit.

6. An electrical junction box according to claim 1, wherein
 (i) said connector module is mounted at a lower portion of said casing,
 (ii) said fuse circuit portion is located laterally of said connector module at a first side of said casing,
 (iii) said relay circuit portion is located above said connector module at said first side of said casing,
 (iv) an electronic control unit is mounted in said casing above said connector module,
 (v) said casing has a connector accommodation portion to receive at least one electrical connector, in use, located at a further side thereof extending orthogonally to said first side thereof, and
 (vi) said connector module has bus bars which project into said connector accommodation portion to constitute tabs therein for connection to said at least one connector, in use.

7. An electrical junction box according to claim 1, wherein said flexible conductors of said connector module are individual single-core wires.

8. An electrical junction box according to claim 1, wherein said flexible conductors of each said insulation substrate are conductors of a flexible flat cable arranged on said second main surface of the insulation substrate, said flexible flat cable comprising insulation material in which said conductors are held.

9. An electrical junction box according to claim 1, mounted on a vehicle.

10. An electrical junction box according to claim 9, wherein said flexible conductors of said circuit module are individual single-core wires.

11. An electrical junction box according to claim 9, wherein said flexible conductors of said circuit module are conductors of at least one flexible flat cable, said flexible flat cable comprising insulation material in which said conductors are held.

12. An electrical junction box comprising:
 an electrical circuit adapted to make electrical connection, in use, to electrical connectors, fuses and relays, said electrical circuit comprising a fuse connection circuit, a relay connection circuit and a connector connection circuit which is electrically connected to said fuse connection circuit and said relay connection circuit,
 said electrical junction box having a connector module providing said connector connection circuit and comprising
  (i) an insulation substrate having a first main surface and a second main surface opposite said first main surface,
  (ii) a plurality of first electrical conductors on said first main surface and a plurality of second electrical conductors on said second main surface,
 said first electrical conductors being parallel to each other and extending in a first direction and said second electrical conductors being parallel to each other and extending in a second direction orthogonal to said first direction and crossing said first electrical conductors at crossing points,
 said first and second conductors being of a form selected from:
  (a) said first electrical conductors are elongate bus bars and said second electrical conductors are flexible conductors of a flexible flat cable comprising flexible insulation material in which said flexible conductors thereof are held,
  (b) said first electrical conductors are individual flexible single-core wires, and said second electrical conductors are flexible conductors of a flexible flat cable comprising flexible insulation material in which said flexible conductors thereof are held, and
  (c) said first electrical conductors are flexible conductors of a first flexible flat cable comprising flexible insulation material in which said flexible conductors thereof are held, and said second electrical conductors are flexible conductors of a second flexible flat cable comprising flexible insulation material in which said flexible conductors thereof are held, and
 wherein at a plurality of said crossing points the mutually crossing first and second electrical conductors are connected to each other to provide desired electrical junctions.

13. An electrical junction box according to claim 12, wherein said first and second electrical conductors have the form (a) and said elongate bus bars are fixed to said insulation substrate by deformation of material of said insulation substrate, and wherein at each said electrical junction said insulation substrate has an aperture and said insulation material of said flexible flat cable is absent to expose the respective flexible conductor which is bent into said aperture and welded to the respective bus bar.

14. An electrical junction box according to claim 12, wherein said fuse connection circuit and said relay connection circuit comprise bus bars having pressure-connection terminals which are connected by pressure connections to said flexible conductors of said flexible flat cables, to effect electrical connection of said connector module to said fuse connection circuit and said relay connection circuit.

15. An electrical connection box according to claim 12 mounted on a vehicle.

* * * * *

UNITED STATES PATENT AND TRADEMARK OFFICE
CERTIFICATE OF CORRECTION

PATENT NO. : 6,677,521 B2
DATED : January 13, 2004
INVENTOR(S) : Tatsuya Sumida et al.

It is certified that error appears in the above-identified patent and that said Letters Patent is hereby corrected as shown below:

<u>Title page,</u>
Item [30], Foreign Application Priority Data, add:
-- Nov. 1, 2000 (JP) ………………... 2000-334784 --

Signed and Sealed this

Eighteenth Day of May, 2004

JON W. DUDAS
*Acting Director of the United States Patent and Trademark Office*